(12) United States Patent
Chang

(10) Patent No.: US 12,315,815 B2
(45) Date of Patent: May 27, 2025

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventor: Shih-Ming Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 334 days.

(21) Appl. No.: 17/726,223

(22) Filed: Apr. 21, 2022

(65) Prior Publication Data

US 2023/0178489 A1  Jun. 8, 2023

Related U.S. Application Data

(60) Provisional application No. 63/286,918, filed on Dec. 7, 2021.

(51) Int. Cl.
*H01L 23/535* (2006.01)
*H01L 21/768* (2006.01)
(Continued)

(52) U.S. Cl.
CPC ...... *H01L 23/535* (2013.01); *H01L 21/76805* (2013.01); *H01L 21/76895* (2013.01);
(Continued)

(58) Field of Classification Search
CPC ......... H01L 21/76805; H01L 21/76895; H01L 23/535; H01L 23/5226; H01L 23/5283; H01L 23/53228; H01L 23/53242; H01L 21/76834; H01L 21/76883; H01L 21/76885; H01L 21/76897; H01L 21/76877; H01L 21/32139; H01L 21/823475

See application file for complete search history.

(56) References Cited

U.S. PATENT DOCUMENTS 6,413,872 B1  7/2002  Kitch
9,627,310 B2  4/2017  Chang et al.
(Continued)

FOREIGN PATENT DOCUMENTS

KR  10-2016-0098194 A  8/2016
KR  10-2018-0021105 A  2/2018

*Primary Examiner* — Britt D Hanley
*Assistant Examiner* — Vicki B. Booker
(74) *Attorney, Agent, or Firm* — STUDEBAKER BRACKETT PLLC

(57) ABSTRACT

In a method of manufacturing a semiconductor device, a first conductive pattern and a second conductive pattern are formed over the first conductive pattern, in a first interlayer dielectric (ILD) layer disposed over a substrate. The second conductive pattern contacts the first conductive pattern. A space is formed in the first ILD layer by removing a part of the second conductive pattern to expose a part of the first conductive pattern. The space is filled with a dielectric material. A third conductive pattern is formed over a remaining portion of the second conductive pattern. A via contact connecting the first conductive pattern and the third conductive pattern is formed by patterning the remaining portion of the second conductive pattern as an etching mask.

20 Claims, 20 Drawing Sheets

(51) Int. Cl.
*H01L 23/522* (2006.01)
*H01L 23/528* (2006.01)
*H01L 23/532* (2006.01)

(52) U.S. Cl.
CPC ...... *H01L 23/5226* (2013.01); *H01L 23/5283* (2013.01); *H01L 23/53228* (2013.01); *H01L 23/53242* (2013.01)

(56) References Cited

U.S. PATENT DOCUMENTS

| | | |
|---|---|---|
| 9,786,602 B2 | 10/2017 | Chang et al. |
| 10,366,903 B2 | 7/2019 | Lin et al. |
| 2008/0029898 A1* | 2/2008 | Farooq ................ H01L 23/5226 257/E23.145 |
| 2010/0202208 A1 | 8/2010 | Endo et al. |
| 2012/0038056 A1 | 2/2012 | Cabral, Jr. et al. |
| 2015/0171010 A1 | 6/2015 | Bristol et al. |
| 2017/0256451 A1 | 9/2017 | Boemmels et al. |
| 2018/0090366 A1* | 3/2018 | Deprat ................ H01L 21/8221 |
| 2021/0296231 A1 | 9/2021 | Karpov et al. |

\* cited by examiner

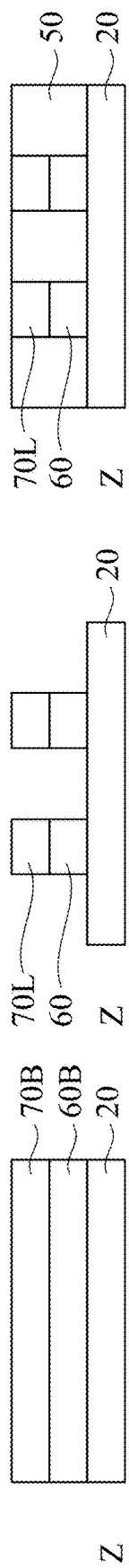
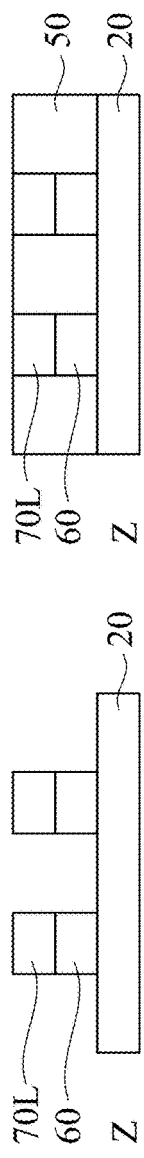
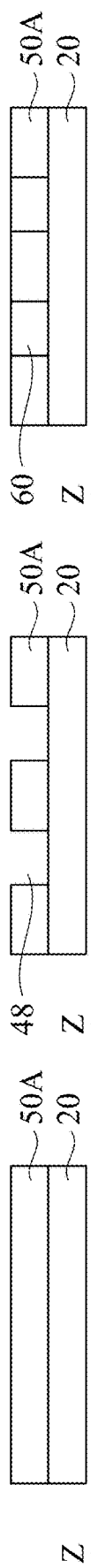
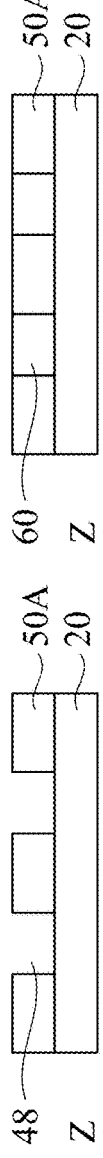
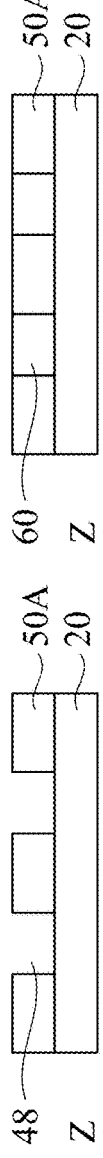
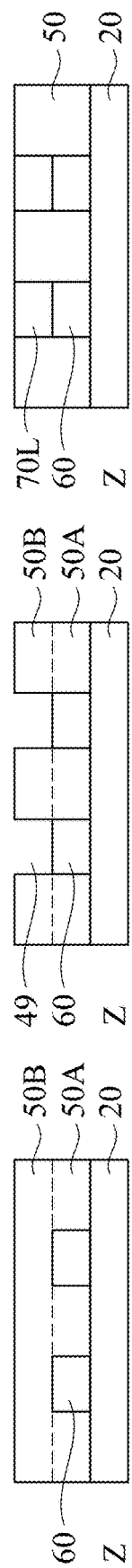
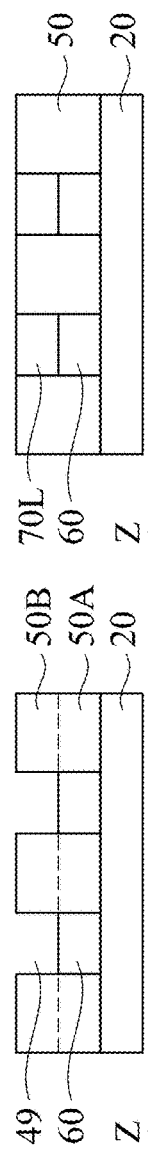
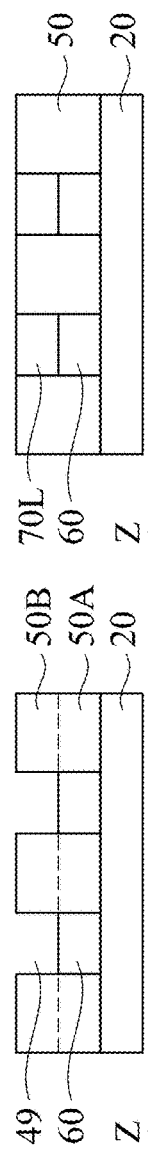
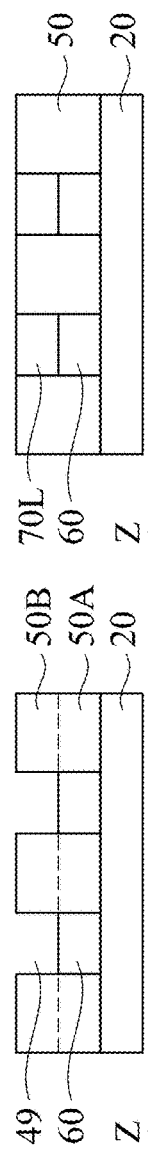
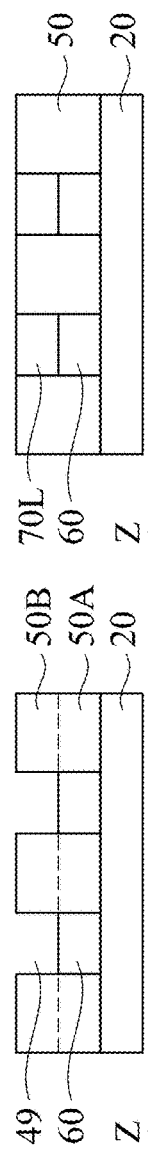

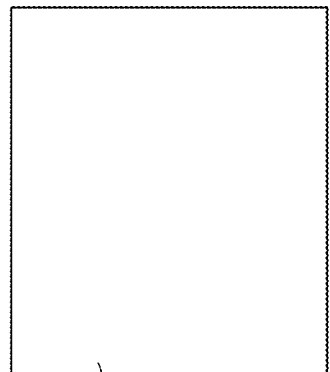
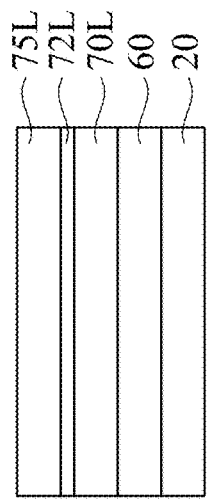
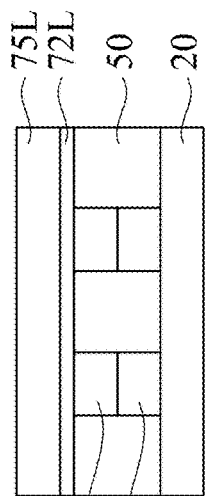
FIG. 4B  FIG. 4C  FIG. 4D
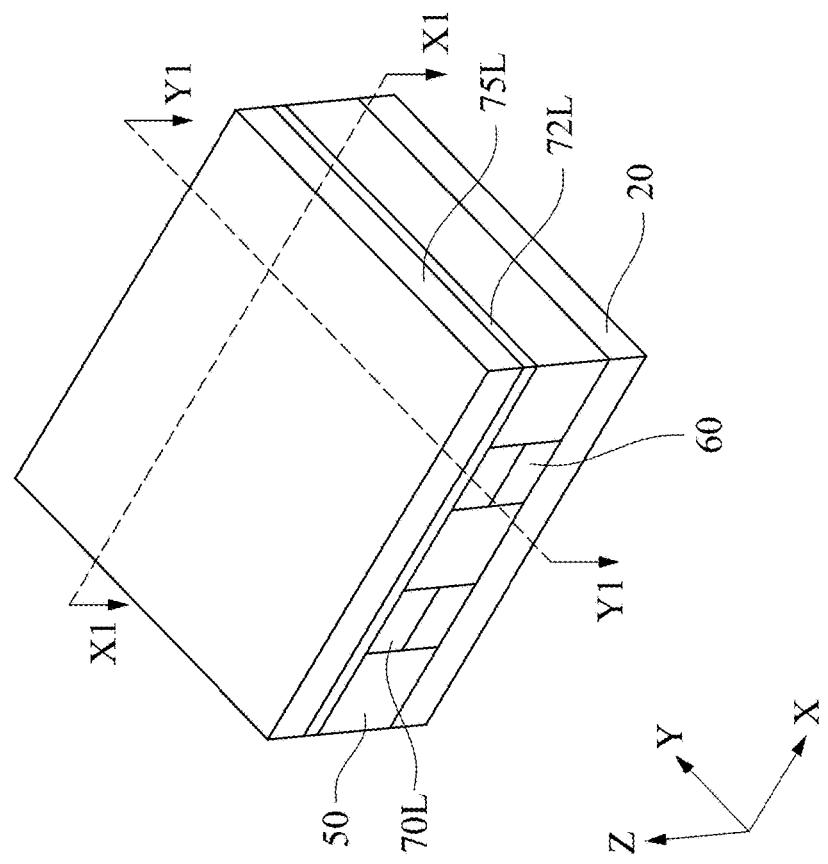
FIG. 4A

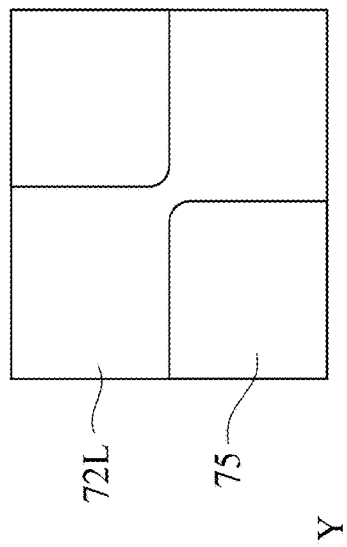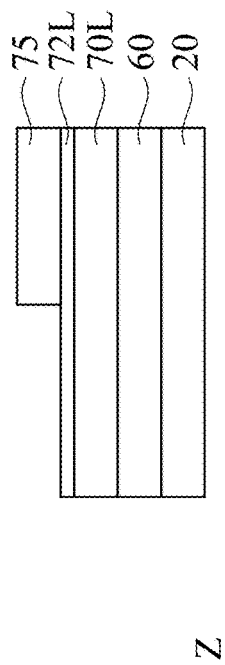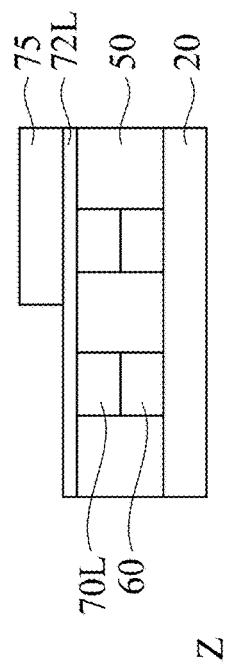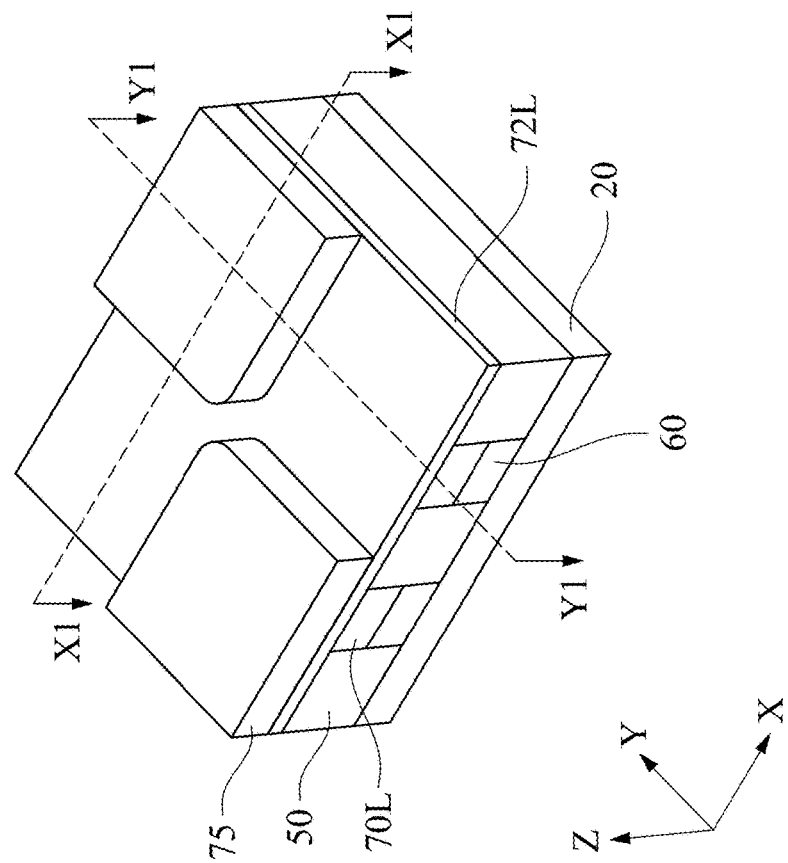

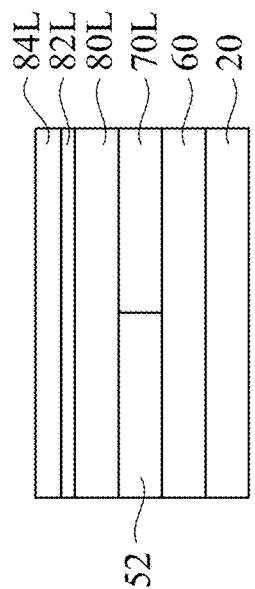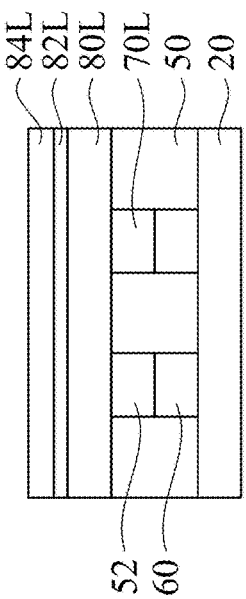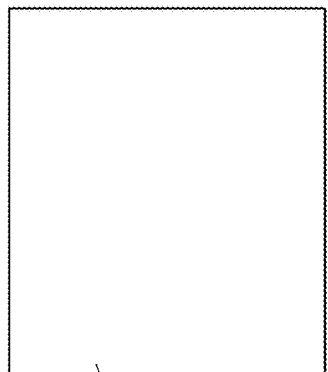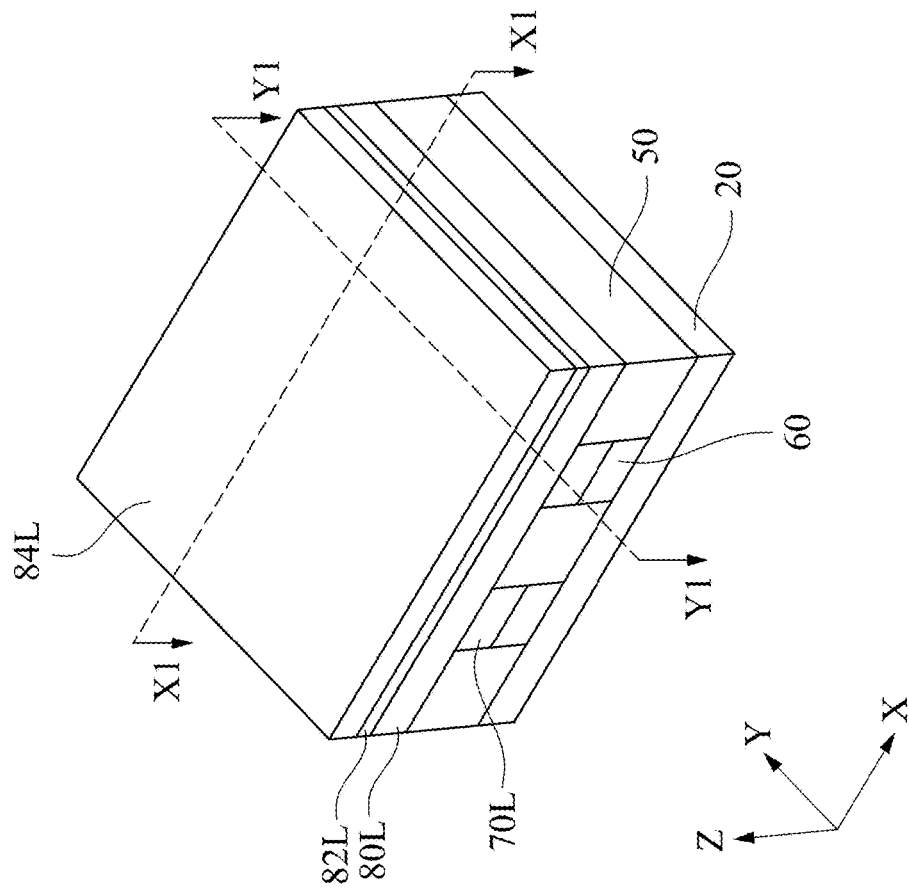

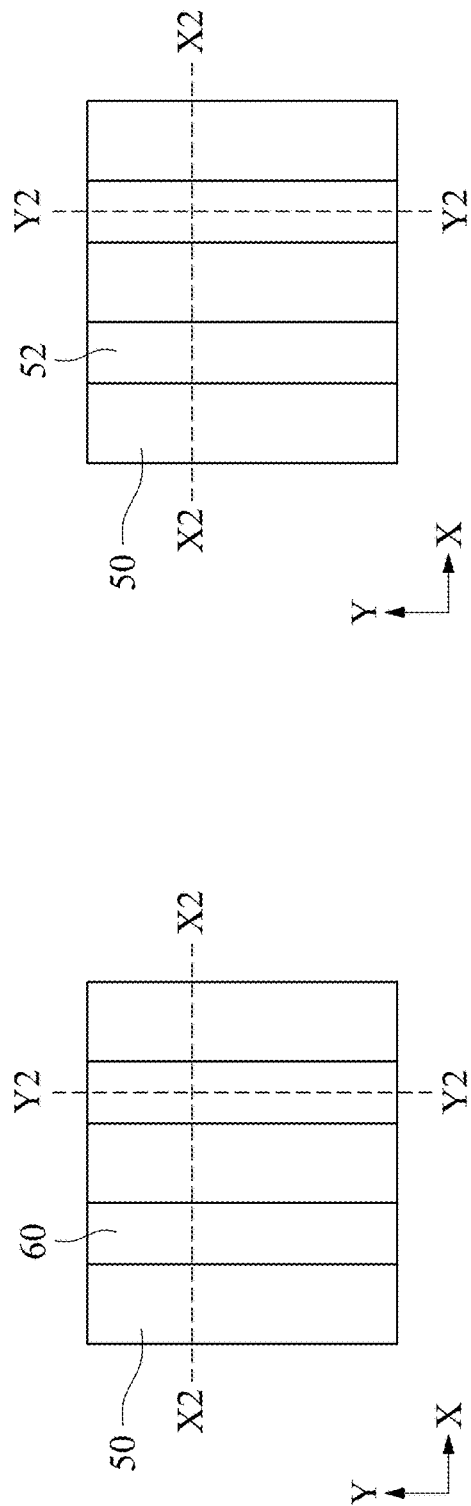
FIG. 19A
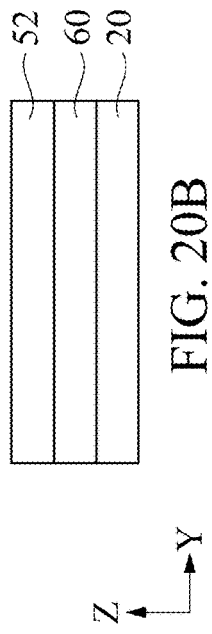
FIG. 19B
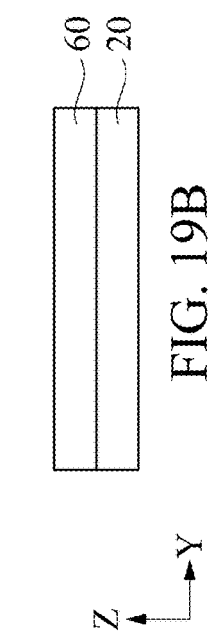
FIG. 19C
FIG. 20A
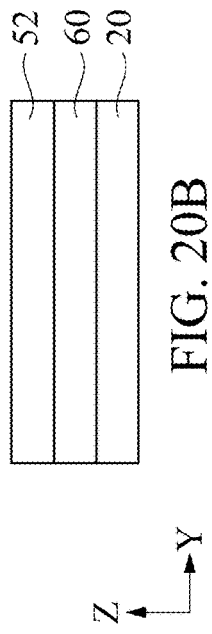
FIG. 20B
FIG. 20C

SEMICONDUCTOR DEVICE AND MANUFACTURING METHOD THEREOF

RELATED APPLICATIONS

This application claims the priority of U.S. Provisional Application No. 63/286,918 filed on Dec. 7, 2021, the entire contents of which application are incorporated herein by reference.

BACKGROUND

Semiconductor devices (integrated circuits) include multiple wiring layers having wiring patterns and via contacts connecting vertically adjacent wiring patterns to achieve complex circuitry functions. In forming a via contact and a metal wiring during semiconductor device fabrication, improved overlay control is desired. A damascene process, in particular, a dual damascene process, is widely used to form a via contact and a metal wiring. However, further improvement in the wiring layer formation process is still required to fabricate advanced semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 3B and 3C show views of the various stages of a sequential manufacturing operation of a semiconductor device in accordance with embodiments of the present disclosure. FIGS. 3D, 3E, 3F, 3H, 3I and 3J show views of the various stages of a sequential manufacturing operation of a semiconductor device in accordance with embodiments of the present disclosure.

FIGS. 4A, 4B, 4C and 4D show views of the various stages of a sequential manufacturing operation of a semiconductor device in accordance with embodiments of the present disclosure.

FIGS. 5A, 5B, 5C and 5D show views of the various stages of a sequential manufacturing operation of a semiconductor device in accordance with embodiments of the present disclosure.

FIGS. 11A, 11B, 11C and 11D show views of the various stages of a sequential manufacturing operation of a semiconductor device in accordance with embodiments of the present disclosure.

FIGS. 19A, 19B and 19C show views of the various stages of a sequential manufacturing operation of a semiconductor device in accordance with embodiments of the present disclosure.

FIGS. 20A, 20B and 20C show views of the various stages of a sequential manufacturing operation of a semiconductor device in accordance with embodiments of the present disclosure.

DETAILED DESCRIPTION

Figure 1:
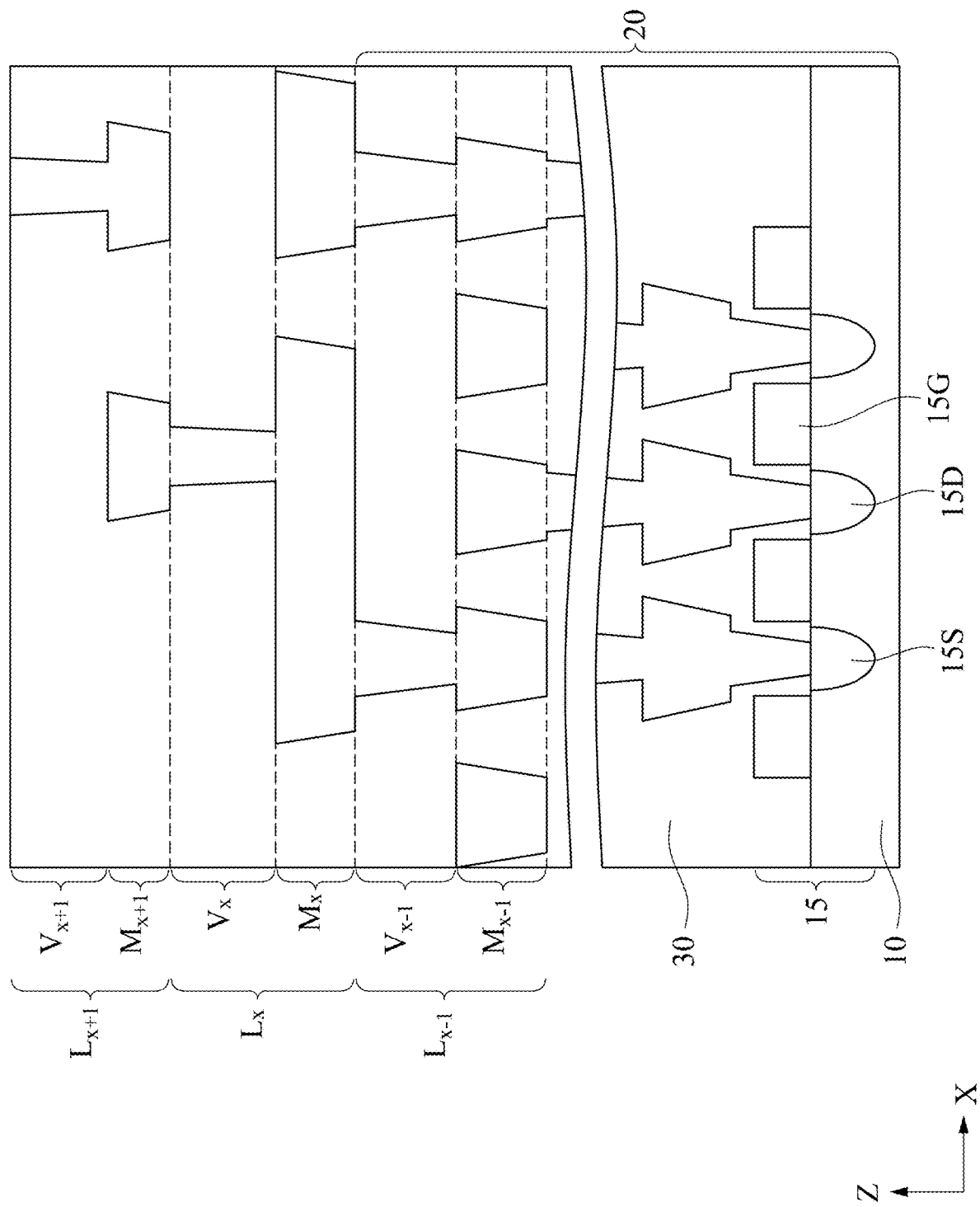
FIG. 1 is a cross sectional view of a semiconductor device in accordance with embodiments of the present disclosure.
Figure 2B:
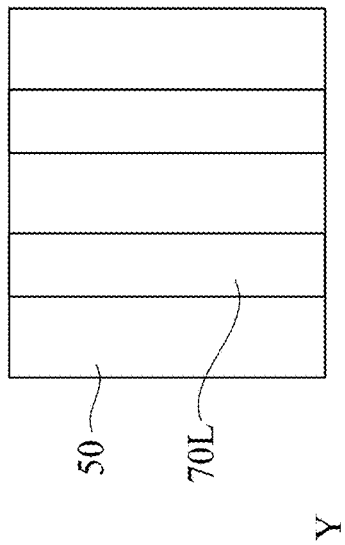
FIGS. 2A, 2B, 2C and 2D show views of the various stages of a sequential manufacturing operation of a semiconductor device in accordance with embodiments of the present disclosure.
Figure 2C:
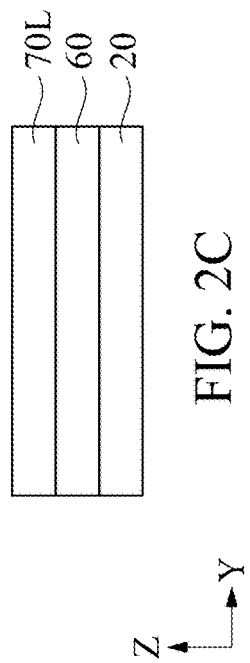
Figure 2D:
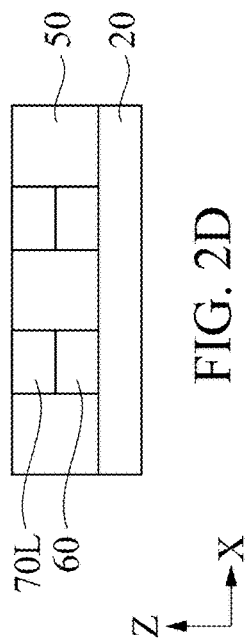
Figure 2A:
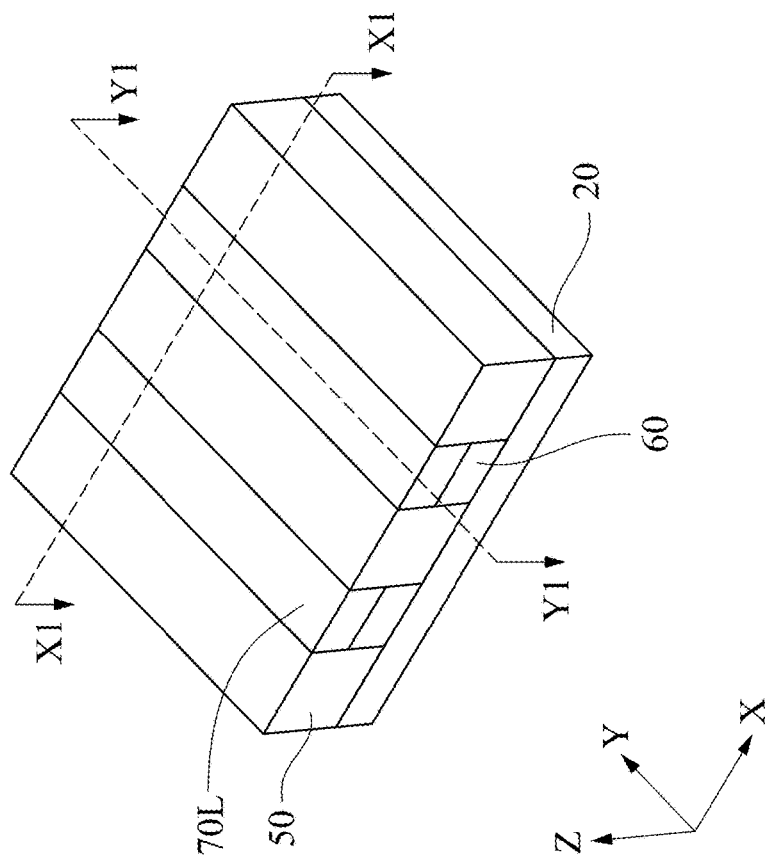
Figure 6B:
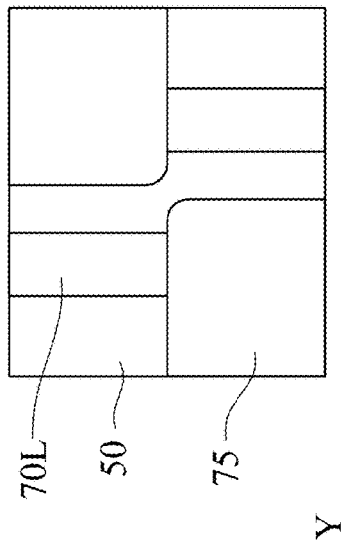
FIGS. 6A, 6B, 6C and 6D show views of the various stages of a sequential manufacturing operation of a semiconductor device in accordance with embodiments of the present disclosure.
Figure 6C:
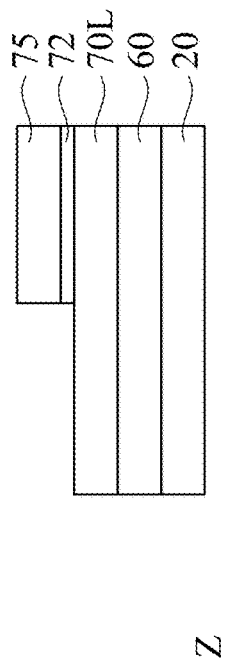
Figure 6D:
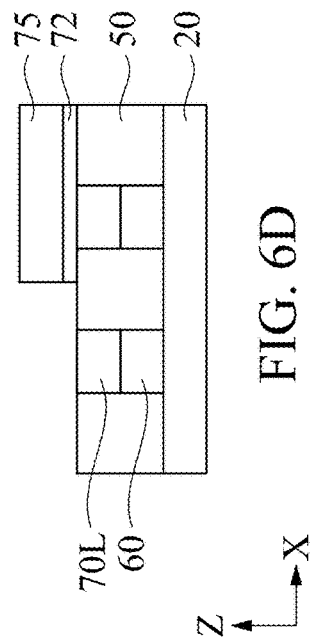
Figure 6A:
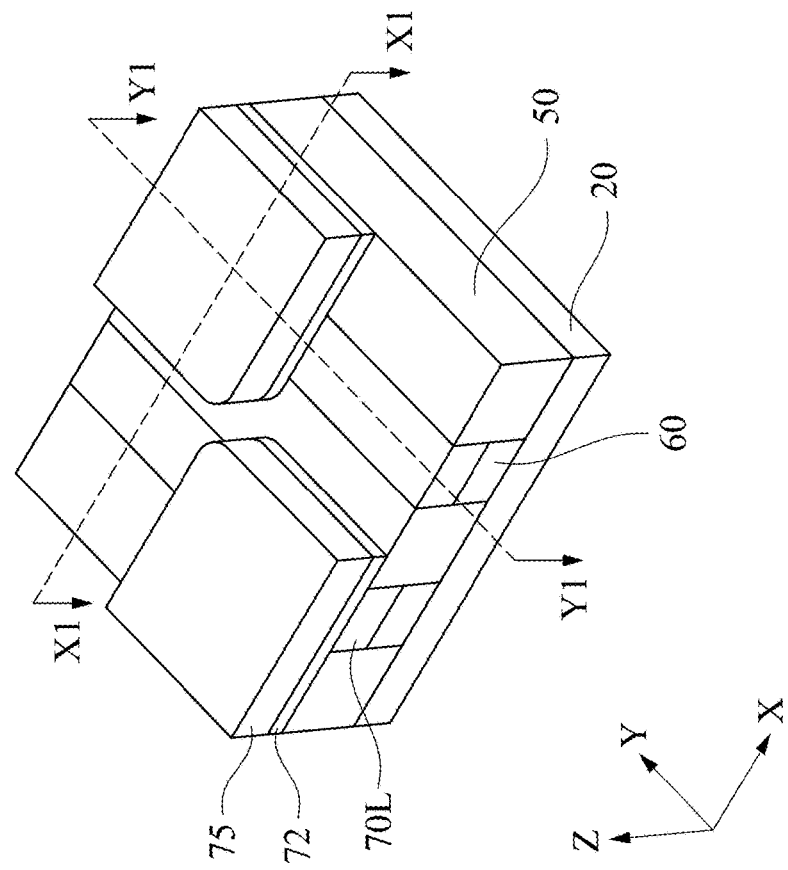
Figure 7B:
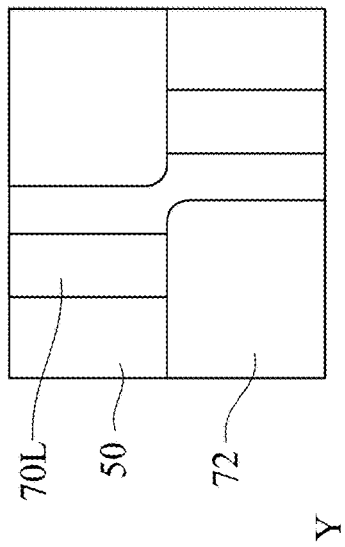
FIGS. 7A, 7B, 7C and 7D show views of the various stages of a sequential manufacturing operation of a semiconductor device in accordance with embodiments of the present disclosure.
Figure 7C:
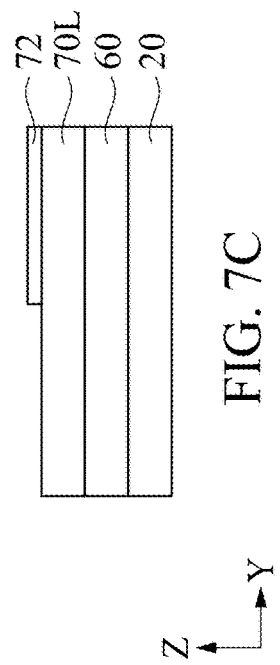
Figure 7D:
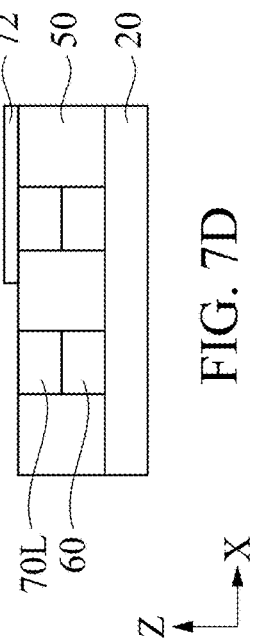
Figure 7A:
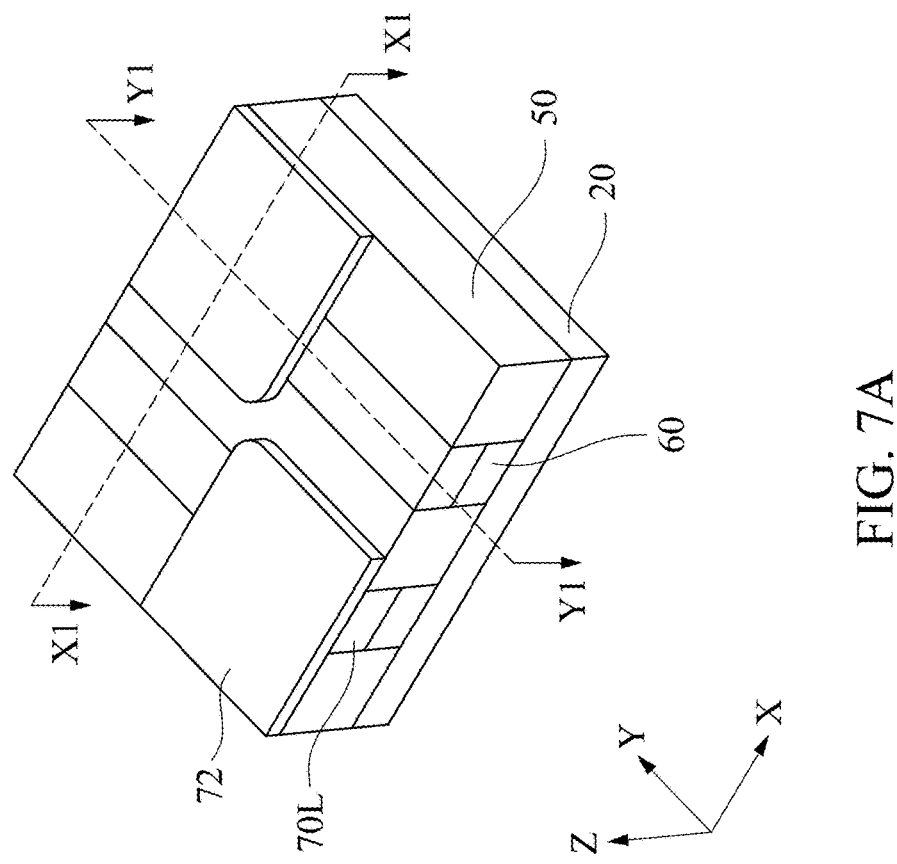
Figure 8B:
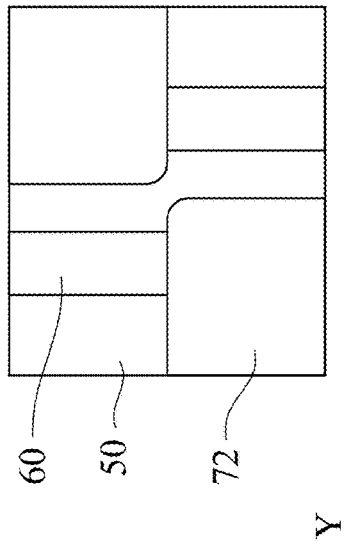
FIGS. 8A, 8B, 8C and 8D show views of the various stages of a sequential manufacturing operation of a semiconductor device in accordance with embodiments of the present disclosure.
Figure 8C:
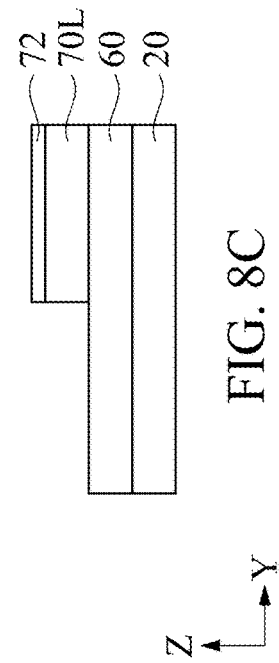
Figure 8D:
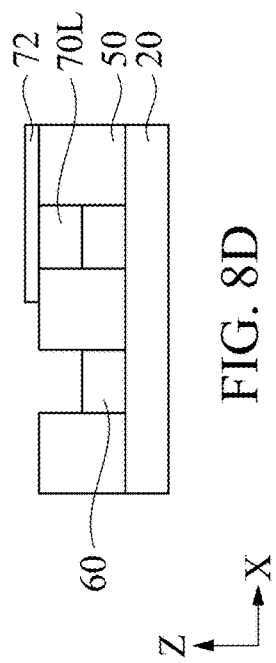
Figure 8A:
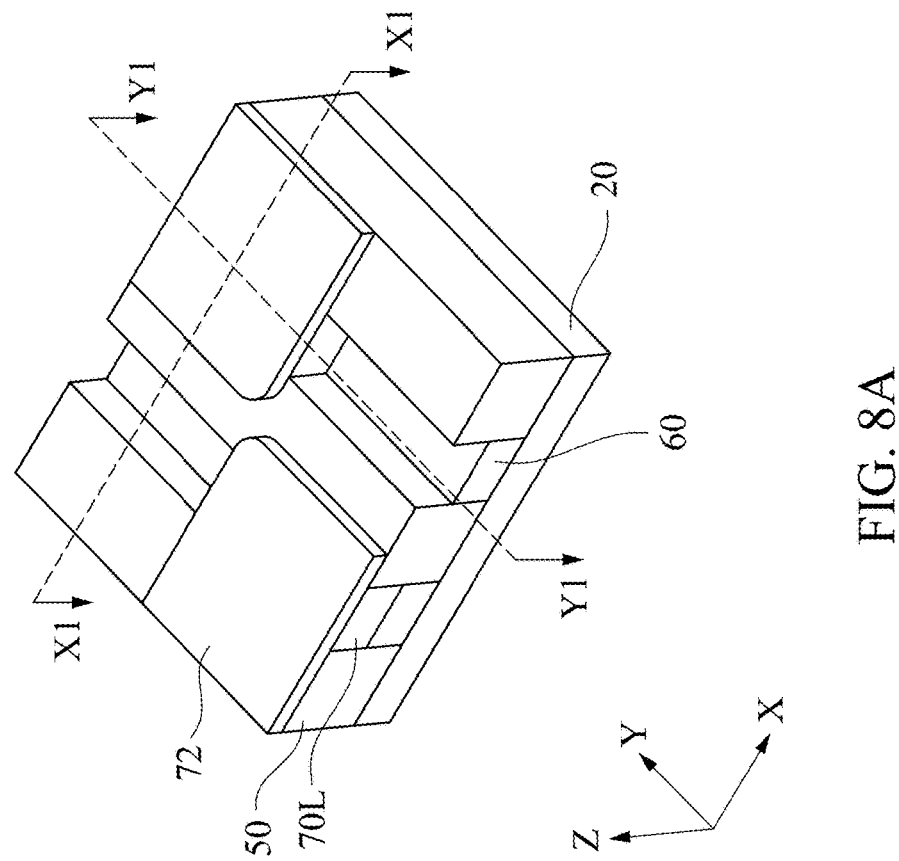
Figure 9B:
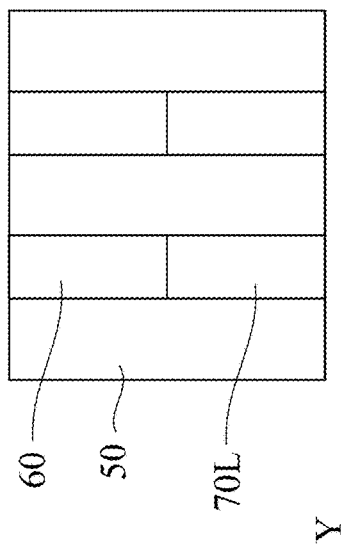
FIGS. 9A, 9B, 9C and 9D show views of the various stages of a sequential manufacturing operation of a semiconductor device in accordance with embodiments of the present disclosure.
Figure 9C:
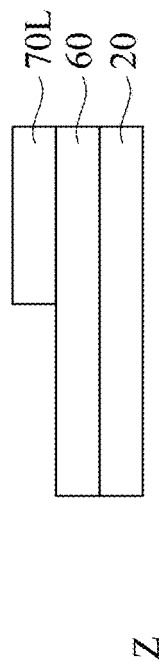
Figure 9D:
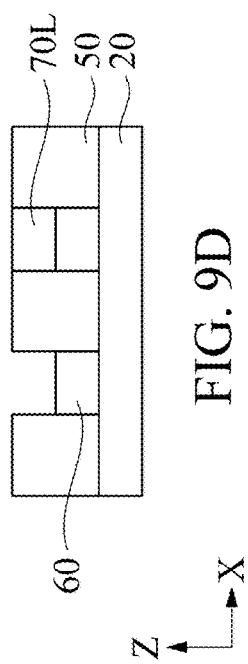
Figure 9A:
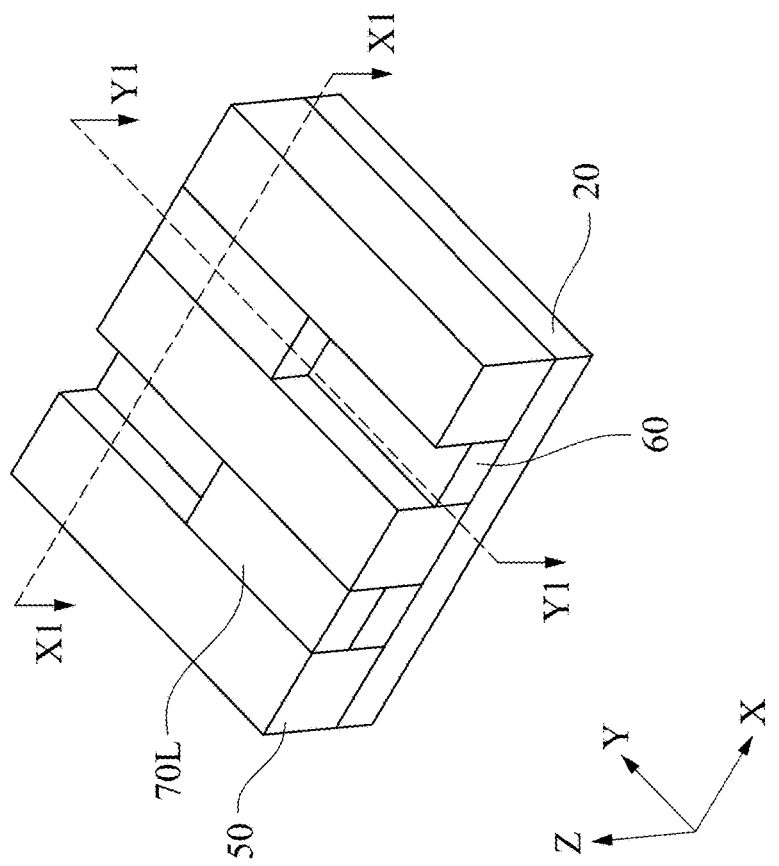
Figure 10B:
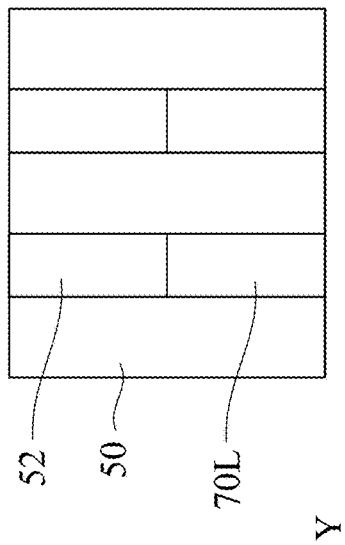
FIGS. 10A, 10B, 10C and 10D show views of the various stages of a sequential manufacturing operation of a semiconductor device in accordance with embodiments of the present disclosure.
Figure 10C:
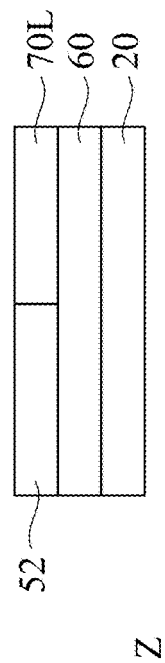
Figure 10D:
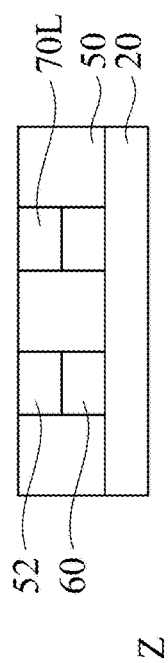
Figure 10A:
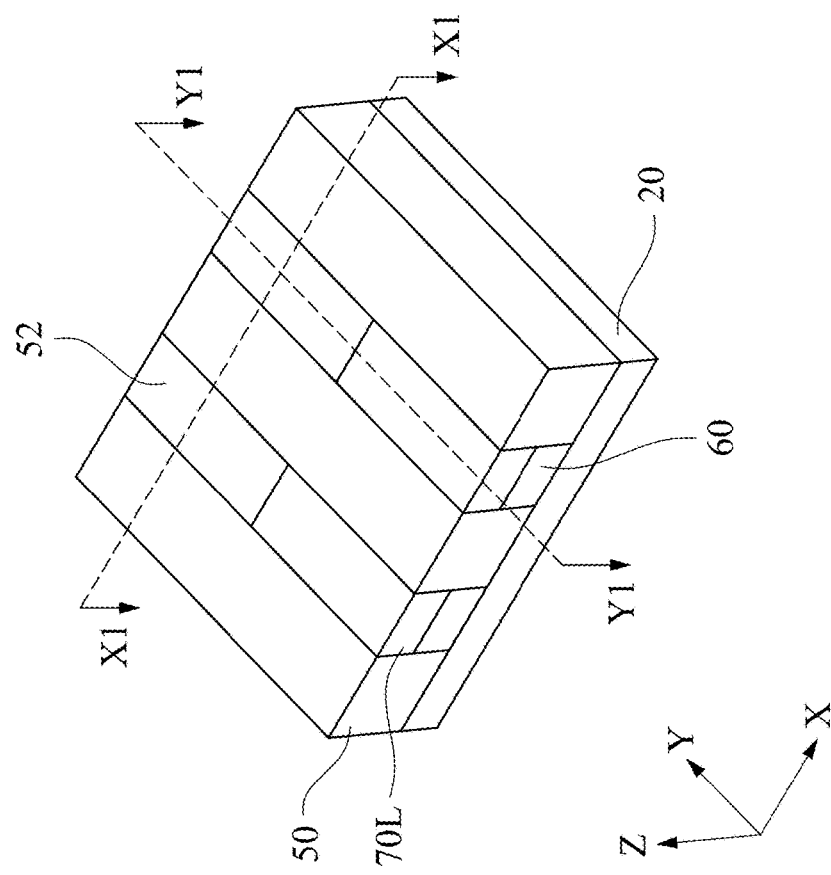
Figure 12B:
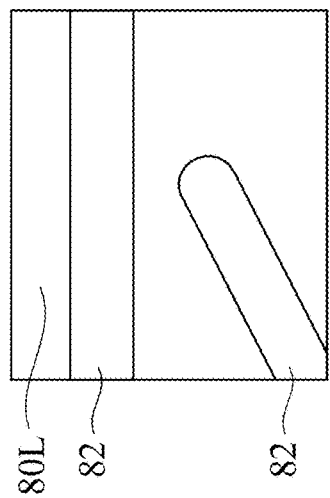
FIGS. 12A, 12B, 12C and 12D show views of the various stages of a sequential manufacturing operation of a semiconductor device in accordance with embodiments of the present disclosure.
Figure 12C:
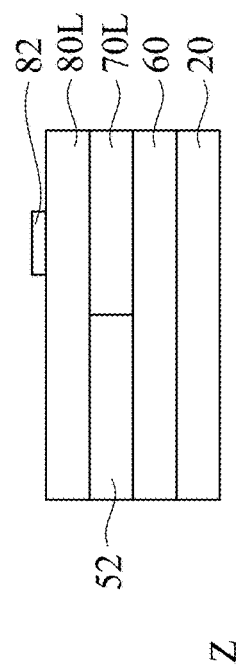
Figure 12D:
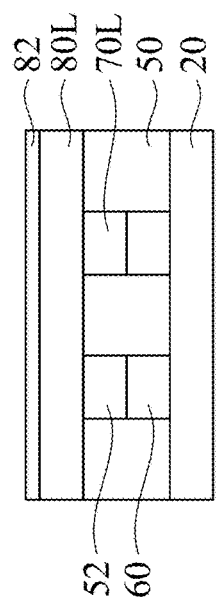
Figure 12A:
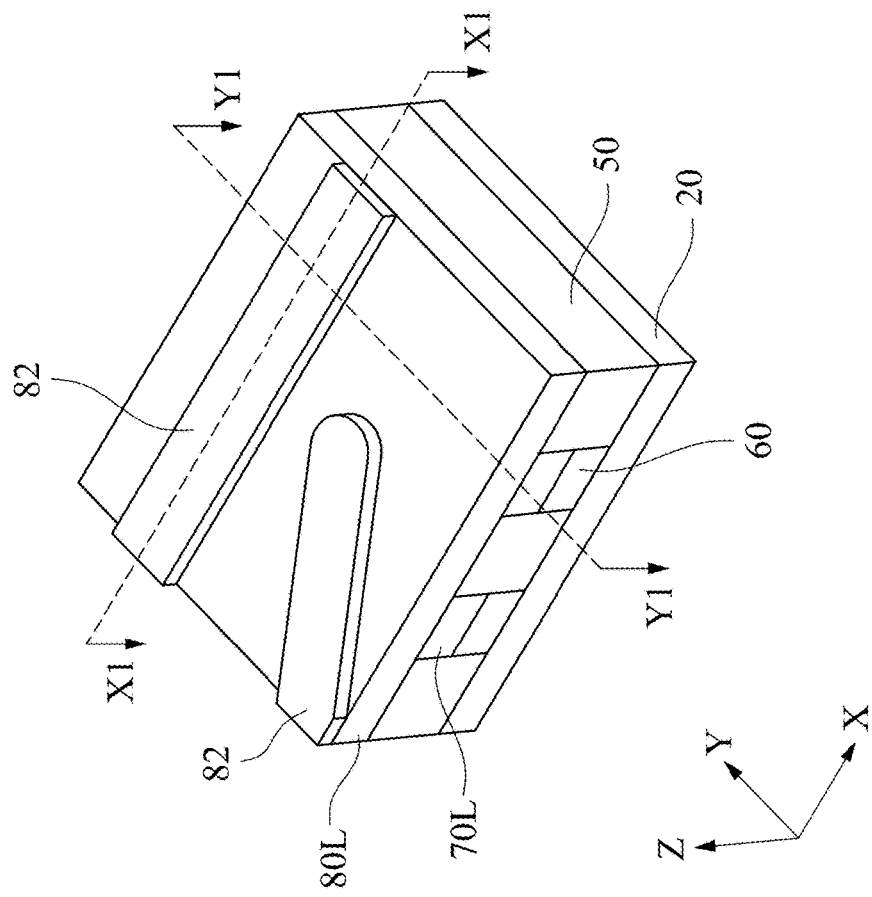
Figure 13B:
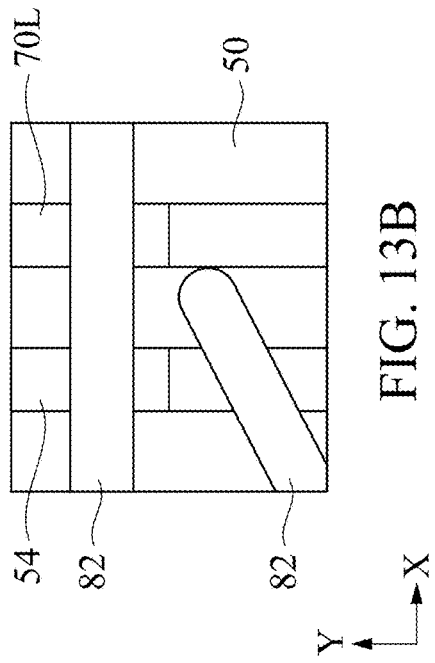
FIGS. 13A, 13B, 13C and 13D show views of the various stages of a sequential manufacturing operation of a semiconductor device in accordance with embodiments of the present disclosure.
Figure 13C:
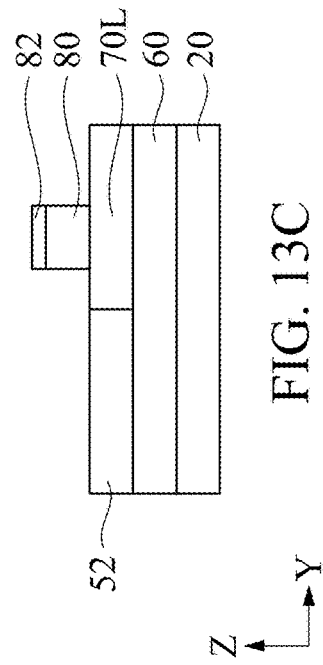
Figure 13D:
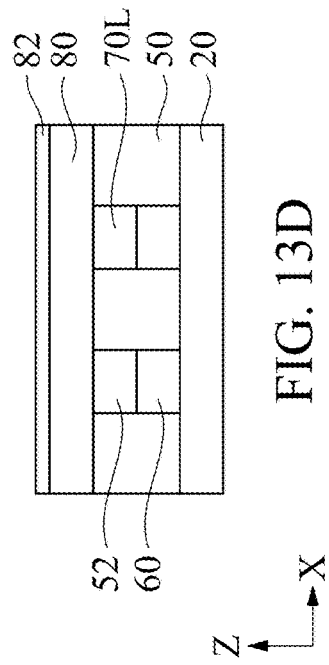
Figure 13A:
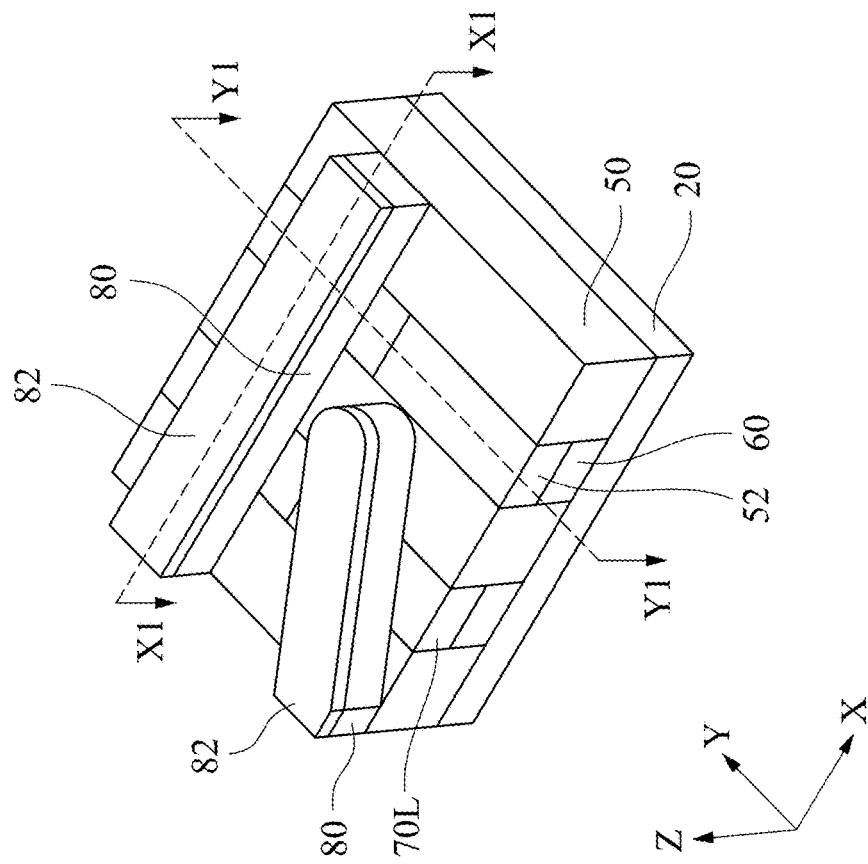
Figure 14B:
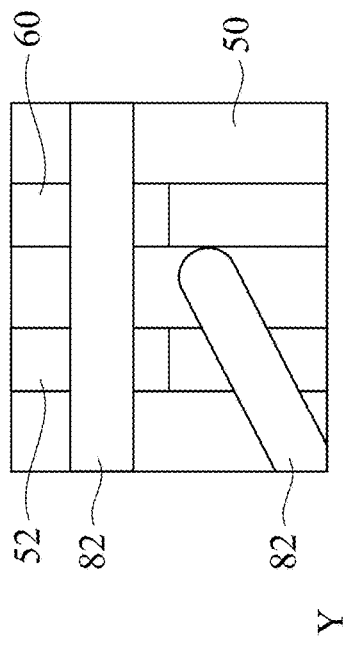
FIGS. 14A, 14B, 14C and 14D show views of the various stages of a sequential manufacturing operation of a semiconductor device in accordance with embodiments of the present disclosure.
Figure 14C:
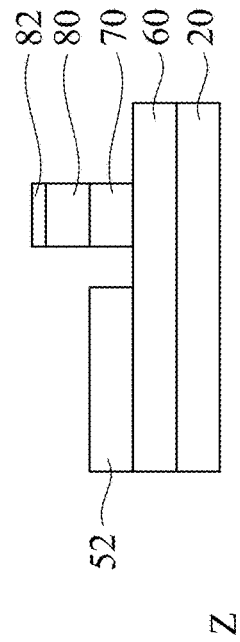
Figure 14D:
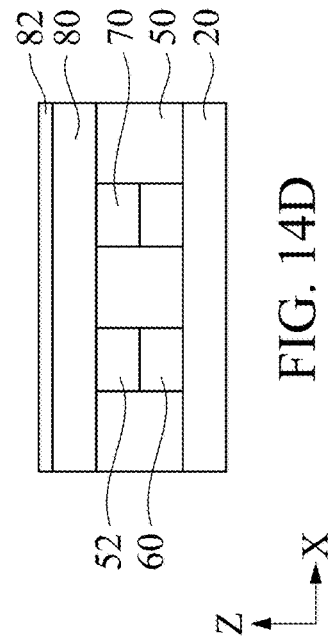
Figure 14A:
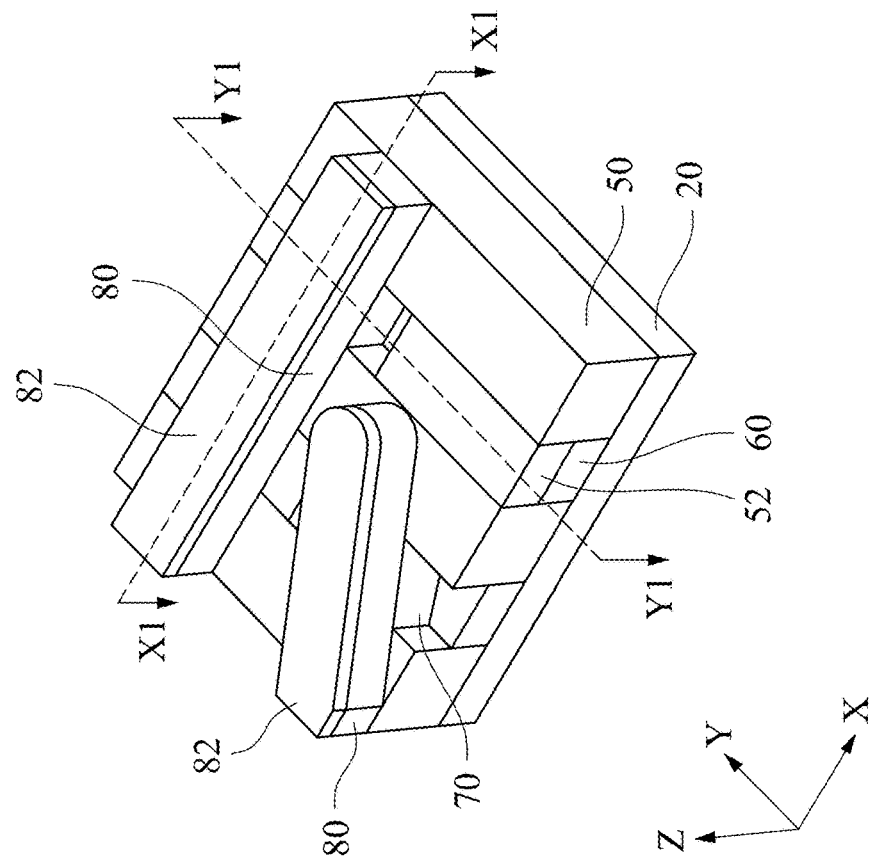
Figure 15B:
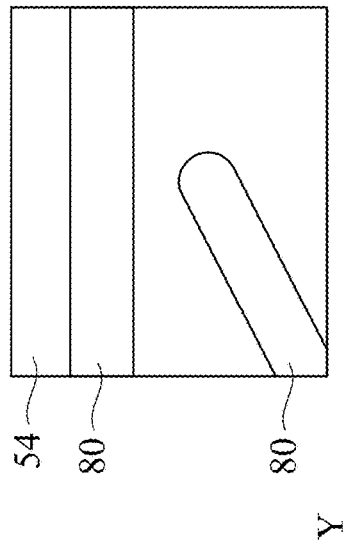
FIGS. 15A, 15B, 15C and 15D show views of the various stages of a sequential manufacturing operation of a semiconductor device in accordance with embodiments of the present disclosure.
Figure 15C:
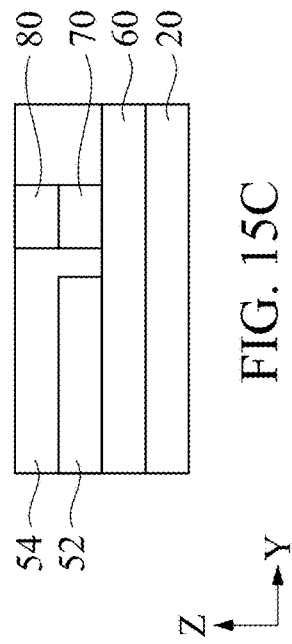
Figure 15D:
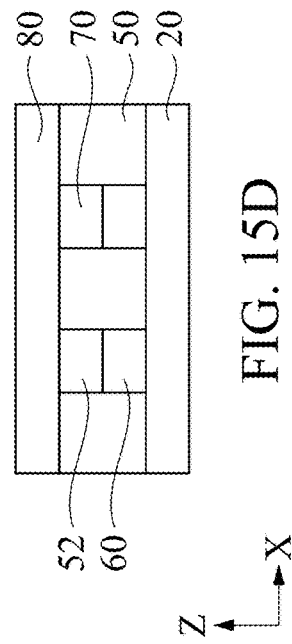
Figure 15A:
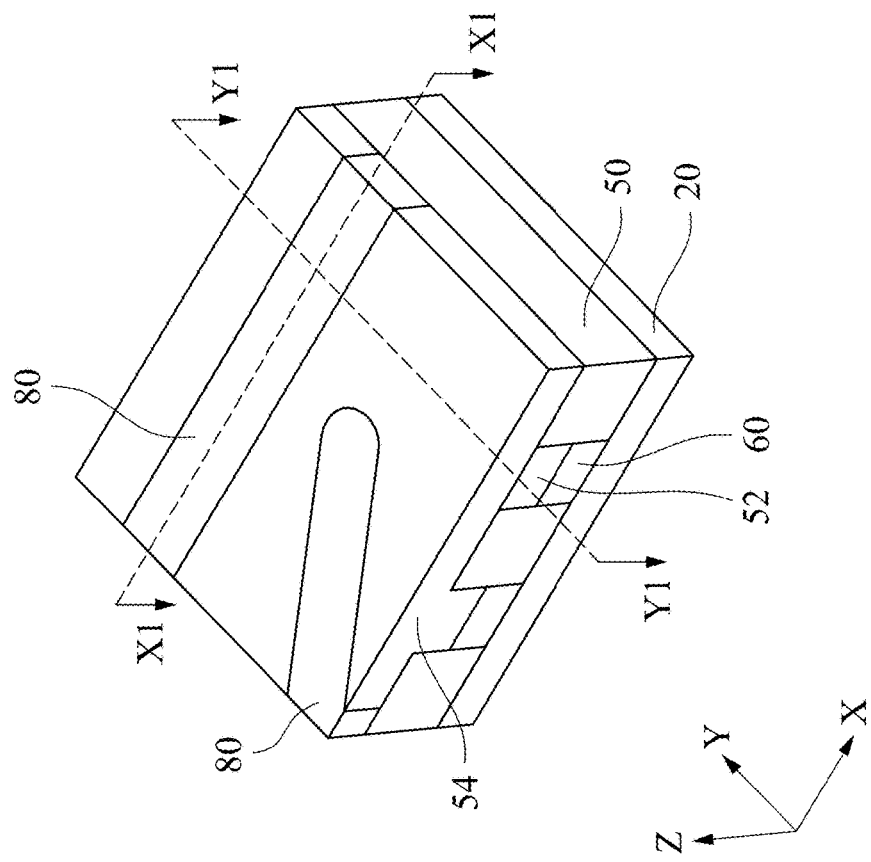

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. The numerical values, ranges, dimensions, material, processes, configurations and/or arrangements described below are mere examples and not limited to those disclosed, and other values, ranges, dimensions, material, processes, configurations and/or arrangements may be within the scope of the present disclosure, unless otherwise explained.

In the back-end-of-line (BEOL) process for forming metal wiring layers, a dual damascene process is used, in which trenches for metal lines (conductive wiring patterns) and holes for via contacts are fabricated, and then the trenches and the holes are filled with conductive material at the same time. In the dual damascene process, a via contact and a metal wiring pattern disposed over the via contact (i.e., the metal wiring layer is above the via contact) are formed at the same time. As the critical dimensions (CDs) of the trenches and/or the holes become smaller, it is more difficult to fill the very narrow trenches and holes with conductive material. Further, an overlay error between the via contact and the metal layer (formed over the via contact) in the dual damascene process may cause either a high electrical resistance or an electrical short circuit. The via contact overlay error may also induce a smaller space between the metal wiring patterns on the same level, which may increase the risk of an electrical short circuit. In addition, the via contact overlay error combined with over-etching during formation of the hole for the via contact may induce a cross layer tunnel and cause an electrical short circuit.

In the present disclosure, a novel process to form metal wiring patterns and via contacts by using a metal etching process, which can reduce various effects caused by an overlay error is provided. In particular, the present embodiments provide a self-aligned process between a via contact and a metal wiring pattern disposed above the via contact. More specifically, the via contacts are formed by an etching process for forming the metal wiring patterns thereabove.

FIG. 1 is a cross sectional view of a semiconductor device including multiple wiring layers in accordance with embodiments of the present disclosure.

In some embodiments, transistors 15, such as field effect transistors (FETs), are disposed over a substrate 10. In some embodiments, the FET 15 includes a gate electrode 15G, a source 15S and a drain 15D. In the present disclosure, a source and a drain are interchangeably used and may have the same structure. In some embodiments, the FET is a planar FET, a fin FET (Fin FET) or a gate-all-around (GAA) FET. In some embodiments, one or more interlayer dielectric (ILD) layers 30 are formed over the FETs.

In some embodiments, the substrate 10 may be made of a suitable elemental semiconductor, such as silicon, diamond or germanium; a suitable alloy or compound semiconductor, such as Group-IV compound semiconductors (e.g., silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide (InGaAs), indium arsenide, indium phosphide, indium antimonide, gallium arsenic phosphide, or gallium indium phosphide), or the like. The substrate 10 includes isolation regions in some embodiments, such as a shallow trench isolation (STI), located between active regions and separating one or more electronic elements from other electronic elements.

In some embodiments, multiple wiring layers $L_x$ (x-th wiring layer) are formed over the FETs, where x is 1, 2, 3, . . . , as shown in FIG. 1. Each of the wiring layers $L_x$ includes conductive wiring pattern $M_x$ and via contacts $V_x$ connected above the wiring patterns $M_x$, and each of the wiring layers $L_{x+1}$ ((x+1)-th wiring layer) includes conductive wiring pattern $M_{x+1}$ and via contacts $V_{x+1}$ connected above the wiring patterns $M_{x+1}$. Similarly, the wiring layers $L_{x-1}$ include conductive wiring pattern $M_{x-1}$ and via contacts $V_{x-1}$ connected above the wiring patterns $M_{x-1}$.

In some embodiments, when the wiring layers $L_x$ include wiring patterns $M_x$ extending in the X direction, the wiring layers $L_{x+1}$ include wiring patterns $M_{x+1}$ extending in the Y direction. In other words, X-direction metal wiring patterns and Y-direction metal wiring patterns are alternately stacked in the vertical direction. In some embodiments, x is up to 20. In some embodiments, the wiring layer $L_1$ includes the closest wiring patterns $M_1$ to the FETs 15 except for local interconnects. Each of the wiring layers $L_x$ also includes one or more ILD layers or inter-metal dielectric (IMD) layers. In other embodiments, the wiring layer includes via contacts formed above the metal wiring patterns.

FIGS. 2A-2D to FIGS. 16A-16D show various stages of a sequential manufacturing operation of a semiconductor device in accordance with embodiments of the present disclosure. It is understood that additional operations can be provided before, during, and after processes shown by FIGS. 2A-16D, and some of the operations described below can be replaced or eliminated, for additional embodiments of the method. The order of the operations/processes may be interchangeable. In FIGS. 2A-2D and 4A-4D to 16A-16D, the "A" figures are perspective views, the "B" figures are plan views (views from the top), the "C" figures are cross sectional views along line Y1-Y1 (along the Y direction) of the "A" figures, and the "D" figures are cross sectional views along line X1-X1 (along the X direction) of the "A" figures.

As shown in FIGS. 2A-2D, one or more first wiring patterns (first conductive patterns) 60 extending in the Y direction are formed in a first interlayer dielectric (ILD) layer 50 disposed over an underlying structure 20 (see, FIG. 1) disposed over the substrate 10. Further, a first conductive pattern 70L for via contacts is formed over the first wiring pattern 60 and embedded in the first ILD layer 50. The first ILD layer 50 includes one or more dielectric layers disposed over the FETs as shown in FIG. 1. In some embodiments, the first wiring pattern 60 is formed over the underlying structure 20 and embedded in the first ILD layer 50. The first wiring pattern 60 corresponds to, for example, the wiring layer $M_x$ shown in FIG. 1 in some embodiments, or local interconnects directly disposed on the source and/or drain of the FETs.

In some embodiments, the first wiring pattern 60 includes one or more layers of conductive material, such as Cu, Al, Ru, W, Co, Ti or Ta or an alloy thereof. In some embodiments, the thickness of the first wiring pattern 60 is in a range from about 20 nm to about 200 nm. When the first wiring pattern is made of a single metal element, the purity of the metal element is more than 99% in some embodiments. In some embodiments, the purity is less than 100% and the first wiring pattern 60 may include an impurity, such as carbon. In some embodiments, Ru, Co or Cu is used. In some embodiments, the first wiring pattern 60 is formed by chemical vapor deposition (CVD), physical vapor deposition (PVD) including sputtering, plating or atomic layer deposition (ALD).

In some embodiments, the first conductive pattern 70L includes one or more layers of a conductive material, such as Cu, Al, Ru, W, Co, Ti or Ta or an alloy thereof. In some embodiments, the first conductive pattern 70L includes one or more barrier or adhesion layers (e.g., Ti, TiN, Ta and/or TaN) and one or more body layers (e.g., Cu, Ru, Co, etc.). In some embodiments, the first conductive pattern 70L, in particular, the body layer, is made of the same material as or different material from the first wiring pattern 60. In some embodiments, the first wiring pattern 60 is made of Cu or a Cu alloy and the first conductive pattern 70L is made of Ru or a Ru alloy. In some embodiments, the thickness of the first conductive pattern 70L is in a range from about 20 nm to about 200 nm. In some embodiments, the first conductive pattern 70L include a body layer and a cap layer disposed on the body layer. When the first conductive pattern 70L, in particular, the body layer, is made of a single metal element, the purity of the metal element is more than 99% in some embodiments. In some embodiments, the purity is less than 100% and the material may include an impurity, such as carbon. As shown in FIGS. 2A-2D, the conductive pattern 70L has a line shape same as the first wiring pattern 60.

In some embodiments, the first ILD layer 50 includes one or more layers of silicon oxide, SiON, SiOCN, SiCN, SiOC, silicon nitride, an organic material, a low-k dielectric material, or an extreme low-k dielectric material.

FIGS. 3A-3C show a sequential operation for manufacturing the structure shown in FIGS. 2A-2D. In some embodiments, the first wiring pattern 60 and the first conductive pattern 70L are formed by an etching operation. As shown in FIG. 3A, a blanket layer 60B for the first wiring pattern 60 is formed over the underlying layer 20 and a blanket layer 70B for the first conductive pattern 70L is formed over the blanket layer 60B. Then, as shown in FIG. 3B, the blanket layer 70B and the blanket layer 60B are patterned by one or more lithography and etching operations, to form line patterns. In some embodiments, a hard mask pattern (not shown) is formed over the blanket layer 70B, and the blanket layer 70B is patterned into the first conductive pattern 70L. Then, the blanket layer 60B is patterned by using the hard mask pattern and the patterned first conductive pattern 70L as an etching mask to form the first wiring pattern 60. Then, the hard mask pattern is removed. In some embodiments, the hard mask pattern includes one or more dielectric materials (e.g., silicon nitride, aluminum oxide, hafnium oxide, zirconium oxide, etc) or one or more metal or metal nitride layers, such as Ta, Ti, TaN or TiN. In some embodiments, after the hard mask pattern is removed, the blanket layer 60B is patterned by using the patterned first conductive pattern 70L as an etching mask. Next, as shown in FIG. 3C, the first ILD layer 50 is formed by one or more deposition and planarization (e.g., a chemical mechanical polishing (CMP) operation) operations.

In some embodiments, the first wiring pattern 60 and/or the first conductive pattern 70L are formed by a damascene process, as shown by FIGS. 3D-3J. In some embodiments, a lower layer 50A of the first ILD layer 50 is formed over the underlying layer 20 as shown in FIG. 3D, and then a trench 48 is formed in the lower layer 50A as shown in FIG. 3E. The trench 48 is filled by a conductive material and the first wiring pattern 60 is formed using a CMP operation as shown in FIG. 3F. Then, an upper layer 50B of the first ILD layer 50 is formed over the lower layer 50A as shown in FIG. 3H, and then a trench 49 is formed in the upper layer 50B above the first wiring pattern 60 as shown in FIG. 3I.

In some embodiments, a plasma dry etching process is used to remove the lower and/or upper layers. The etching gas in the plasma etching includes one or more selected from the group consisting of carbon tetrafluoride ($CF_4$), difluoromethane ($CH_2F_2$), trifluoromethane ($CHF_3$), and octafluorocyclobutane ($C_4F_8$) or any proper reactants. In some embodiments, carbon dioxide ($CO_2$) is further added to the plasma source gas. Other suitable etching gases may be used.

The trench 49 is filled by a conductive material and the first conductive pattern 70L is formed using a CMP operation as shown in FIG. 3J. In other embodiments, the first ILD layer 50 is formed over the underlying layer 20, and a trench is formed in the first ILD layer 50. Then, the trench is filled by a conductive material for the first wiring pattern 60 to fill the trench at the middle of the trench depth and another conductive material for the first conductive pattern 70L is filled in the rest of the trench.

After the structure shown in FIGS. 2A-2D is formed, a hard mask layer 72L is formed over the first ILD layer 50 and a photoresist layer 75L is formed over the hard mask layer 72L, as shown in FIGS. 4A-4D. In some embodiments, the hard mask layer 72L is made of a material different from the first conductive pattern 70L. In some embodiments, the hard mask layer 72L includes one or more dielectric materials (e.g., silicon nitride, aluminum oxide, hafnium oxide, zirconium oxide, etc) or one or more metal or metal nitride layers, such as Ta, Ti, TaN or TiN. In some embodiments, TiN is used. In some embodiments, the hard mask layer 72L is formed by CVD, PVD or ALD. In some embodiments, a thickness of the hard mask layer 72L is in a range from about 5 nm to about 100 nm, depending on the process requirements.

Then, by using a lithography operation, the photoresist layer 75L is formed into a photoresist pattern 75 as shown in FIGS. 5A-5D. In some embodiments, the photoresist pattern 75 covers areas under which via contacts are to be formed.

Next, as shown in FIGS. 6A-6D, the hard mask layer 72L is patterned into a hard mask pattern 72 by using the photoresist pattern 75 as an etching mask. As shown in FIGS. 6A-6D, some parts of the first conductive pattern 70L are exposed. Further, the photoresist pattern 75 is removed as shown in FIGS. 7A-7D.

Then, as shown in FIGS. 8A-8D, the exposed first conductive pattern 70L is removed by etching using the hard mask pattern 72 as an etching mask to expose a part of the first wiring pattern 60. In some embodiments, the etching gas in plasma etching includes $Cl_2$ and/or $O_2$, or any other suitable etching gas. When the conductive layer 70L is made of a different material than the first wiring pattern 60, the etching substantially stops at the first wiring pattern 60. The remaining first conductive pattern 70L is an intermediate pattern for a via contact. A trench in the first ILD layer 50 is formed over the exposed part of the first wiring pattern 60. Subsequently, the hard mask pattern 72 is removed as shown in FIGS. 9A-9D.

Next, as shown in FIGS. 10A-10D, a second ILD layer 52 is formed to fill the trench above the part of the first wiring pattern 60. In some embodiments, the second ILD layer 52 is made of the same material as or different material from the first ILD layer 50, and includes one or more layers of silicon oxide, SiON, SiOCN, SiCN, SiOC, silicon nitride, an organic material, a low-k dielectric material, or an extreme low-k dielectric material. In some embodiments, a CMP operation is performed on the second ILD layer 52 to expose the upper surface of the intermediate first conductive pattern 70L.

After the structure shown in FIGS. 10A-10D is formed, a conductive layer 80L for second wiring patterns is formed over the first ILD layer 50, a hard mask layer 82L is formed over the conductive layer 80L, and a photoresist layer 84L is formed over the hard mask layer 82L, as shown in FIGS. 11A-11D.

In some embodiments, the conductive layer 80L for the second wiring patterns includes one or more layers of a conductive material, such as Cu, Al, Ru, W, Co, Ti or Ta or an alloy thereof. In some embodiments, the thickness of the conductive layer 80L is in a range from about 20 nm to about 200 nm. When the conductive layer 80L is made of a single metal element, the purity of the metal element is more than 99% in some embodiments. In some embodiments, the purity is less than 100% and the conductive layer 80L may include an impurity, such as carbon. In some embodiments, Ru, Co or Cu is used. In some embodiments, the conductive layer 80L is formed by CVD, PVD or ALD. In some embodiments, the material of the conductive layer 80L (when the conductive layer 80L includes multiple layers, the material of the upper most layer) is the same as the first conductive pattern 70L and different from the material of the first wiring pattern 60. In some embodiments, the conductive layer 80L is made of Ru or a Ru alloy.

In some embodiments, the hard mask layer 82L is made of a material different from the conductive layer 80L. In some embodiments, the hard mask layer 82L includes one or more dielectric materials (e.g., silicon nitride, aluminum oxide, hafnium oxide, zirconium oxide, etc) or one or more metal or metal nitride layers, such as Ta, Ti, TaN or TiN. In some embodiments, TiN is used. In some embodiments, the hard mask layer 82L is formed by CVD, PVD or ALD. In some embodiments, the hard mask layer 82L is in a range from about 5 nm to about 100 nm, depending on the process requirements.

Next, by using a lithography operation, the photoresist layer 84L is formed into a photoresist pattern for the second wiring patterns. Then, the hard mask layer 82L is patterned into a hard mask pattern 82 by using the photoresist pattern as an etching mask, and the photoresist pattern is removed, as shown in FIGS. 12A-12D Then, as shown in FIGS. 13A-13D, one or more second wiring patterns 80 extending in the X direction and/or in the direction different from the X and Y directions (about 30-60° off) are formed by one or more etching operations. In some embodiments, the etching operation substantially stops at the intermediate first conductive pattern 70L. In some embodiments, the second wiring patterns 80 correspond to the wiring patterns $M_{x+1}$ of FIG. 1.

Then, one or more first via contacts (vias) 70 are formed by patterning the intermediate first conductive pattern 70L using the hard mask pattern 82 and the second wiring pattern 80 as an etching mask, as shown in FIGS. 14A-14D. In some embodiments, the etching gas in the plasma etching includes $Cl_2$ and/or $O_2$, or any other suitable etching gas. When the conductive layer 70L is made of a different material than the first wiring pattern 60, the etching substantially stops at the first wiring pattern 60. In some embodiments, the first via contacts 70 correspond to the via layer $V_x$ in FIG. 1. Subsequently, the hard mask pattern 82 is removed.

Figure 16B:
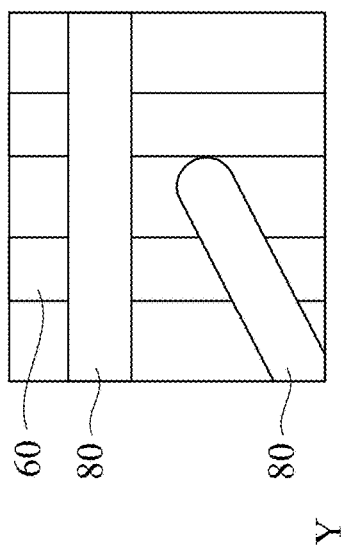
FIGS. 16A, 16B, 16C, 16D and 16E show views of the various stages of a sequential manufacturing operation of a semiconductor device in accordance with embodiments of the present disclosure.
Figure 16C:
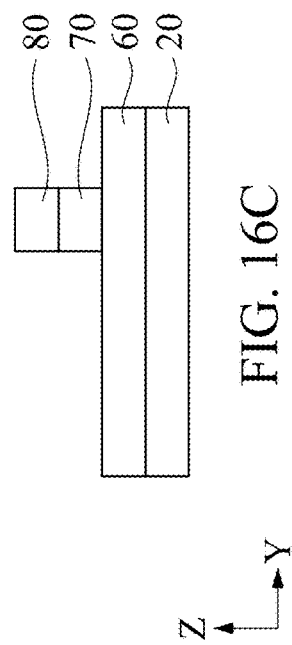
Figure 16D:
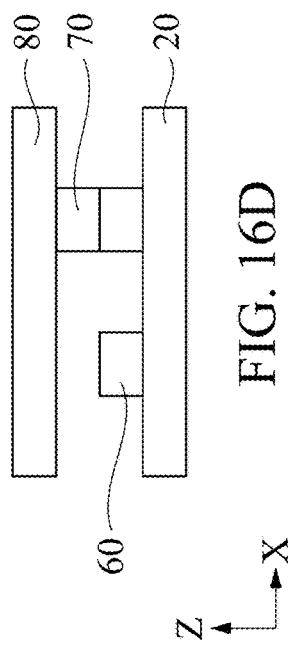
Figure 16A:
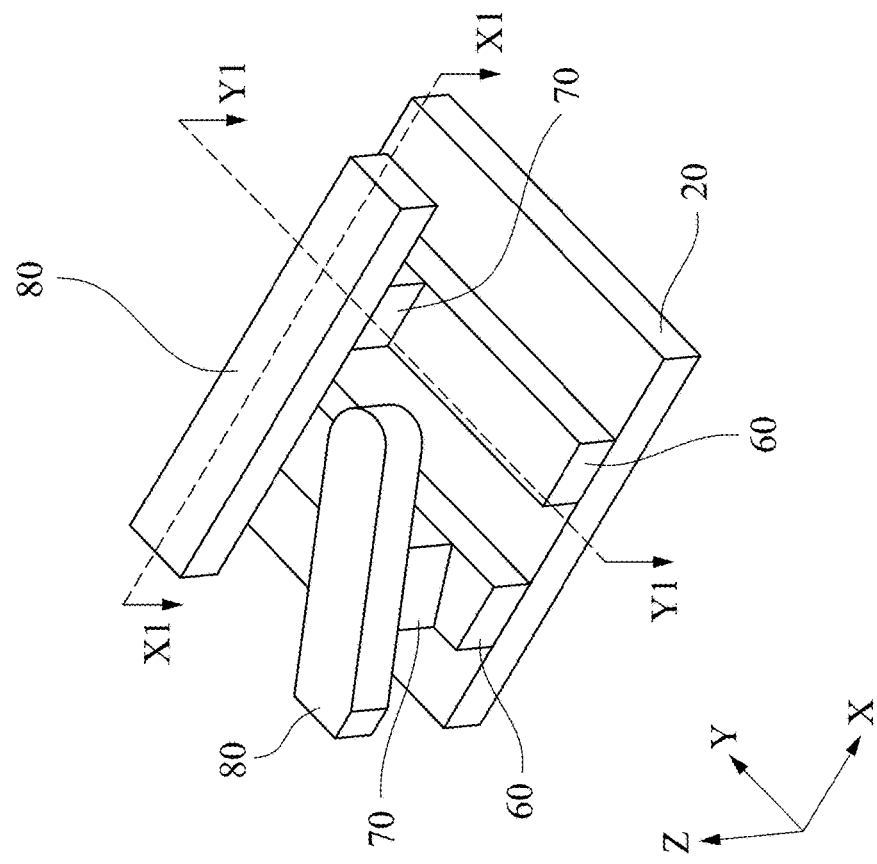
Figure 16E:
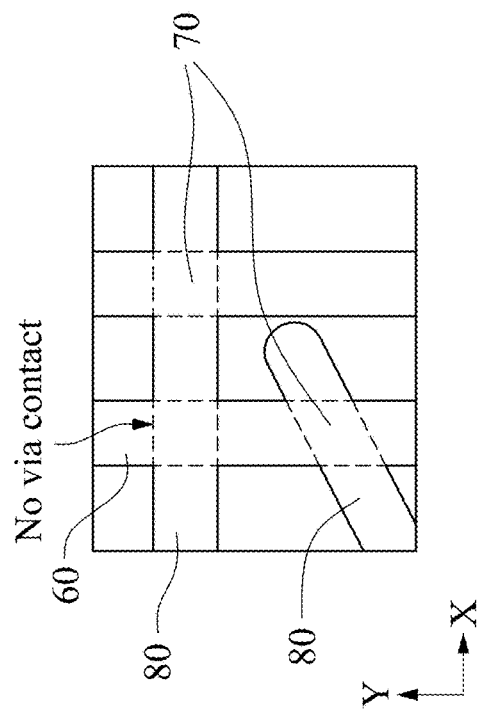

Next, as shown in FIGS. 15A-15D, a third ILD layer 54 is formed over the first ILD layer 50, the second ILD layer 52, the first wiring pattern 60 and the second wiring pattern 80, and a planarization operation, such as an etch back operation or a CMP operation, is performed to expose the upper surface of the second wiring pattern 80. FIGS. 16A-16D are skeleton views without ILD layers, corresponding to FIGS. 15A-15D, respectively, and FIG. 16E shows a projected view of the first and second wiring patterns and the first via contact. In some embodiments, the third ILD layer 54 is made of the same material as or different material from the first ILD layer 50 and/or the second ILD layer 52, and includes one or more layers of silicon oxide, SiON, SiOCN, SiCN, SiOC, silicon nitride, an organic material, a low-k dielectric material, or an extreme low-k dielectric material.

In some embodiments, the second wiring patterns 80 are formed by using a damascene process. In the damascene process, an additional ILD layer is formed over the structures shown in FIGS. 10A-10D, and trenches corresponding to the second wiring patterns 80 are formed in the additional ILD layer. One or more conductive materials are formed to fill the trenches and over the additional ILD layer, and a CMP operation is performed to expose the upper surface of the additional ILD layer. Then, the additional ILD layer is removed in some embodiments. In some embodiments, no hard mask pattern is formed over the second wiring patterns 80, and in such a case, the material of the second wiring patterns 80 is different from the first conductive pattern 70L and the first wiring pattern 60, so that the second wiring patterns 80 appropriately function as an etching mask when the first conductive pattern 70L is etched as shown in FIGS. 14A-14D.

As shown in FIGS. 16A-16D, the first via contacts 70 are formed at some (designed) cross points (intersections) of the first wiring patterns 60 and the second wiring patterns 80 in plan (or projected) view, but not at all cross points. At the cross point where no first via contact is formed (an empty cross point), a space under the second wiring pattern 80 and above the first wiring pattern 60 is filled by the second ILD layer 52 (see, FIGS. 10A-10D and 15D).

As shown in FIG. 16E, the shape of the first via contact 70 at the top of the first via contact 70 (at the interface between the first via contact 70 and the second wiring pattern 80) is an overlapped shape of the first conductive pattern 70L (which has substantially the same shape as the first wiring pattern 60) and the second wiring pattern 80. When the first conductive pattern extends in the Y direction and the second wiring pattern 80 extends in the X direction (perpendicular to each other), the top shape of the first via contact 70 is a rectangle. When the width of the first conductive pattern and the width of the second wiring pattern 80 are the same, the top shape is square, and when the width of the first conductive pattern and the width of the second wiring pattern 80 are different from each other, the top shape is rectangle having long sides and short sides shorter than the long sides.

When the extending direction of the first conductive pattern and the extending direction of the second wiring pattern 80 is different from 90 degrees (e.g., about 30-60 degrees), the top shape of the first via contact 70 is a parallelogram. When the width of the first conductive pattern and the width of the second wiring pattern 80 are the same, the top shape is rhombus.

As shown in FIG. 16E, one or more cross points of the first wiring pattern 60 and the second wiring pattern 80 does not have a first via contact connecting therebetween. As explained with respect to FIGS. 7A-8D, portions of the intermediate first conductive pattern other than the portions of the intermediate first conductive pattern including the first via contact to be formed and the surrounding area are removed, so that the first wiring pattern 60 and the second wiring pattern 80 are not directly connected by a first via contact at the cross point, where no via contact is necessary. On the other hand, at the cross point where the first via contact 70 is necessary, the intermediate first conductive pattern remains by the etching process shown in FIGS. 7A-8D, and the first via contact 70 is formed in a self-align manner as the second wiring pattern 80 functions as an etching mask.

Figure 17C:
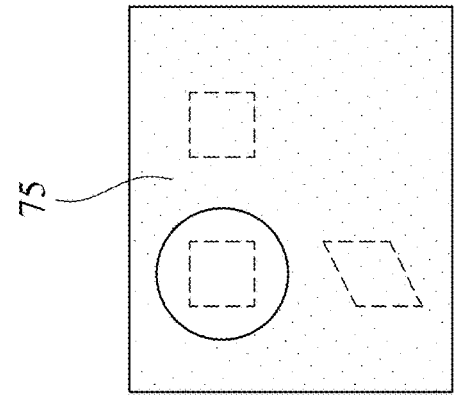
FIGS. 17A, 17B and 17C show views of the various stages of a sequential manufacturing operation of a semiconductor device in accordance with embodiments of the present disclosure.
Figure 17B:
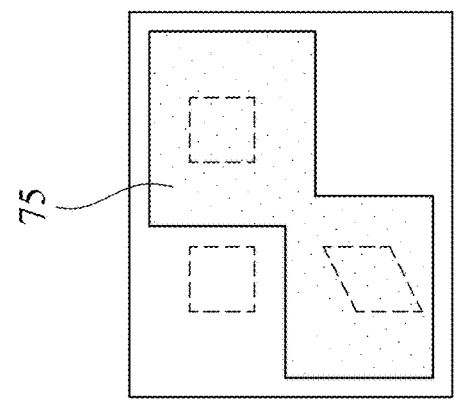
Figure 17A:
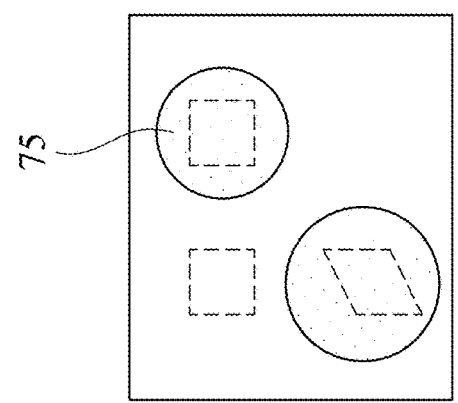

FIGS. 17A-17C shows some variations of the photoresist pattern 75 used in the patterning operations shown in FIGS. 5A-6D. In some embodiments, as shown in FIG. 17A, the photoresist pattern 75 includes island patterns each corresponding to the first via contact to be formed. As shown in FIG. 17A, the size (area) of each of the island patterns is greater (e.g., 25% or more of the via contact) than the size of the first via contact to be formed in plan view, in some embodiments. In some embodiments, one island photoresist pattern includes two or more areas for the first via contacts, as shown in FIG. 17B. In other embodiments, as shown in FIG. 17C, the photoresist pattern 75 includes holes or openings each corresponding to the cross points with no first via contact to be formed. In some embodiments, one opening corresponds to two or more cross points with no first via contact to be formed. In the resist pattern formation process of FIGS. 17A-17C, relatively large patterns larger than the first via contact are formed, and thus a process margin in the lithography operation to form the island patterns can be increased compared with the lithography process for directly forming patterns (e.g., hole patterns) for the first via contacts.

FIGS. 18A, 18B, 18C and 18D show views of the wiring structure of a semiconductor device in accordance with embodiments of the present disclosure.

Figure 18B:
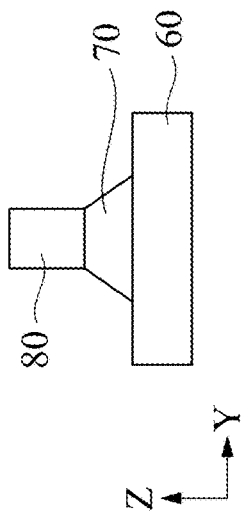
FIGS. 18A, 18B, 18C and 18D show views of the wiring structure of a semiconductor device in accordance with embodiments of the present disclosure.
Figure 18C:
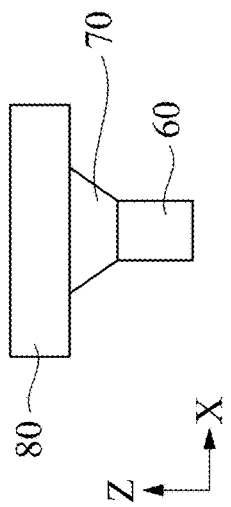
Figure 18D:
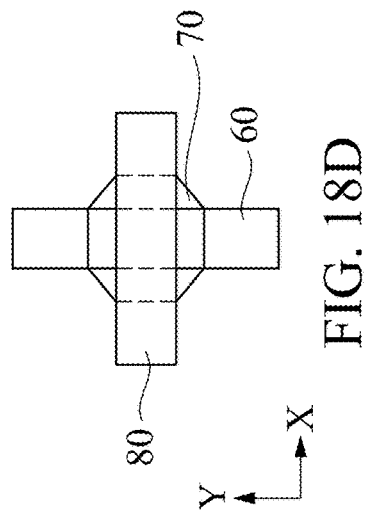
Figure 18A:
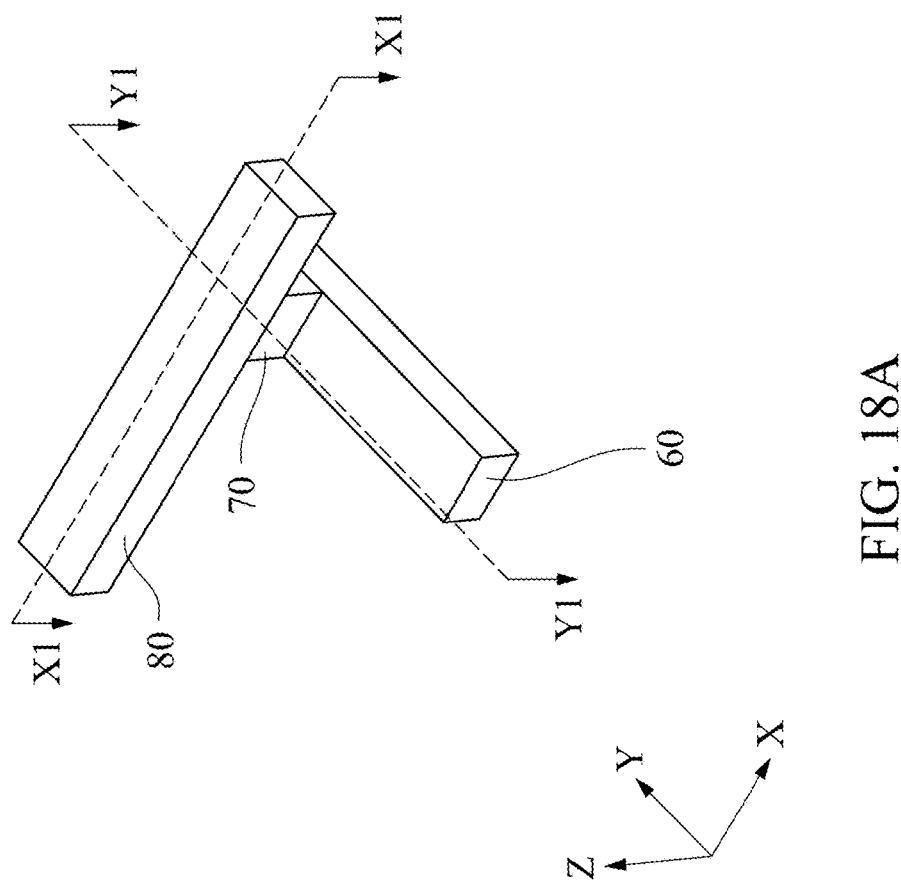
Figure 22A:
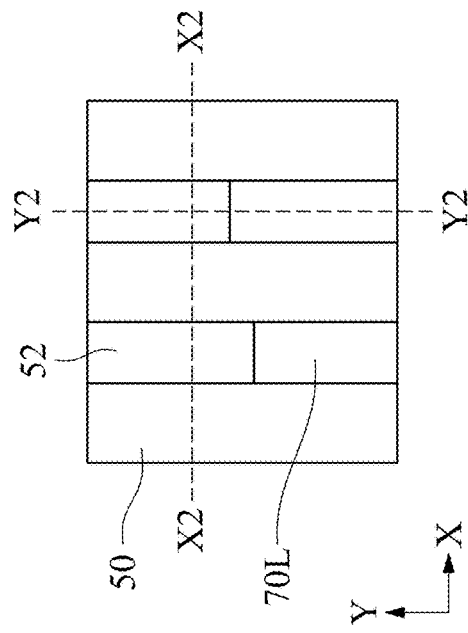
FIGS. 22A, 22B and 22C show views of the various stages of a sequential manufacturing operation of a semiconductor device in accordance with embodiments of the present disclosure.
Figure 22B:
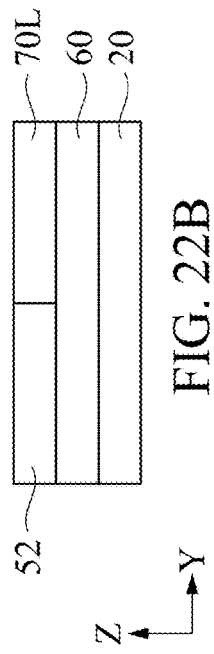
Figure 22C:
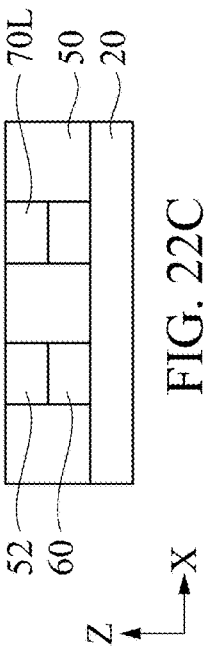

In some embodiments, the side walls (e.g., four side walls) of the first via contact 70 are substantially perpendicular (e.g., 90 degrees±5 degrees) to the upper surface of the first wiring pattern 60 (or the bottom surface of the second wiring pattern 80), as shown in FIG. 18A. In some embodiments, an angle of one or more of the side walls of the first via contact 70 is in a range from about 60 degrees to about 85 degrees with respect to the upper surface of the first wiring pattern 60 or the bottom surface of the second wiring pattern 80, as shown in FIGS. 18B-18D.

In some embodiments, as shown in FIG. 18B, two side walls (YZ planes) of the first via contact 70 are inclined with respect to the upper surface of the first wiring pattern 60, and thus the cross section of the first via contact 70 in the Y direction has a trapezoid having a top smaller than a bottom. The two side walls (XZ planes) of the first via contact 70 are substantially perpendicular to the bottom surface of the second wiring pattern 80 in some embodiments. The shape shown in FIG. 18B can be achieved by applying a taper etching process when etching the intermediate first conductive pattern.

In some embodiments, as shown in FIG. 18C, two side walls (XZ planes) of the first via contact 70 are inclined with respect to the bottom surface of the second wiring pattern 80, and thus the cross section of the first via contact 70 in the X direction has a reverse trapezoid having a top greater than a bottom. The two side walls (YZ planes) of the first via contact 70 are substantially perpendicular to the upper surface of the first wiring pattern 60 in some embodiments. The shape shown in FIG. 18C can be achieved by applying a taper etching process when etching the trench 49 in the upper layer 50B of the first ILD layer 50 as shown in FIG. 3I.

FIG. 18D shows the combination of the structures shown in FIGS. 18B and 18C, when viewed from above. In some embodiments, the first via contact 70 has a twisted cuboid shape. In some embodiments, the contact shape between the first via contact 70 and the first wiring pattern 60 is a rectangle having longer sides extending in the Y direction and shorter sides having substantially the same width (±5%) of the width of first wiring pattern 60 in the X direction. In some embodiments, the contact shape between the first via contact 70 and the second wiring pattern 80 is a rectangle having longer sides extending in the X direction and shorter sides having substantially the same width (±5%) of the width of second wiring pattern 80 in the Y direction. The projected view of the first via contact 70 has an octagonal shape. The contacting area between the first wiring pattern 60 and the first via contact 70 is equal to, smaller than or larger than a contacting area between the second wiring pattern 80 and the first via contact 70.

In the embodiments of FIGS. 18B-18D, the contact areas between the first via contact 70 and the first and/or second wiring patterns are increased, which decreases contact resistance between the first via contact 70 and the first and/or second wiring patterns.

FIGS. 19A-19C to FIGS. 22A-22C show various stages of a sequential manufacturing operation of a semiconductor device in accordance with embodiments of the present disclosure. It is understood that additional operations can be provided before, during, and after processes shown by FIGS. 19A-22C, and some of the operations described below can be replaced or eliminated, for additional embodiments of the method. The order of the operations/processes may be interchangeable. In FIGS. 19A-22C, the "A" figures are plan views, the "B" figures are cross sectional view along line Y2-Y2 (along the Y direction) of the "A" figures, and the "C" figures are cross sectional views along line X2-X2 (along the X direction) of the "A" figures. Materials, processes, configurations and/or dimensions as explained with respect to the above embodiments are applicable to the following embodiments, and detailed explanation thereof may be omitted.

FIGS. 19A-19C correspond to FIG. 3I, where spaces 49 are formed in the first ILD layer 50 above the first wiring patterns 60. Then, the trenches are filled by a second ILD layer 52 as shown in FIGS. 20A-20C in some embodiments. One or more deposition and planarization operations (e.g., CMP) are employed to fill the space 49 with one or more dielectric materials. In some embodiments, the material of the second ILD layer 52 is different from the material of the first ILD layer 50.

Figure 21A:
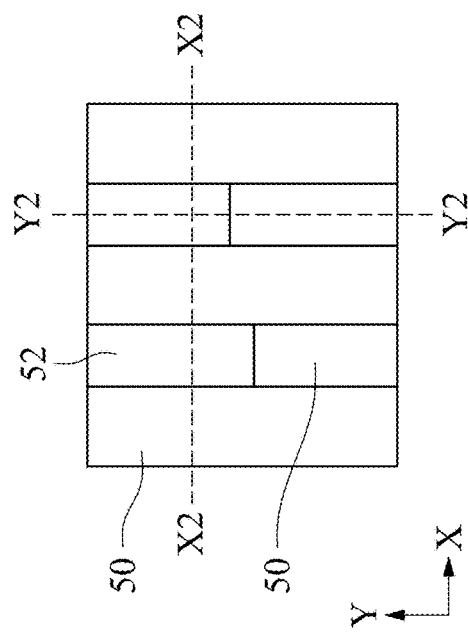
FIGS. 21A, 21B and 21C show views of the various stages of a sequential manufacturing operation of a semiconductor device in accordance with embodiments of the present disclosure.
Figure 21B:
Figure 21C:
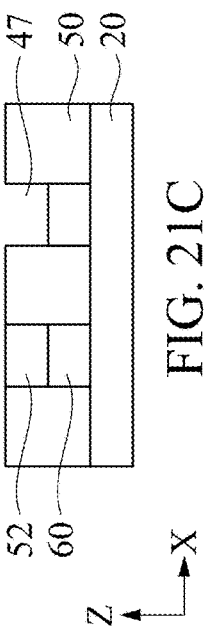

Then, parts of the second ILD layer 52, which correspond to the intermediate first conductive pattern 70L, are removed by etching as shown in FIGS. 21A-21C. The patterning operations are similar to the operations of FIGS. 4A-9A except for the use of the hard mask pattern. In some embodiments, a photoresist layer similar to the photoresist layer 75L is formed over the first and second ILD layers, and then a photoresist pattern similar to the photoresist pattern 75 is formed. Then, the parts of the second ILD layer 52, which correspond to the intermediate first conductive pattern 70L, are removed by etching using the photoresist pattern as an etching mask.

Then, the intermediate conductive patterns 70L are formed by filling the space 47 with one or more conductive materials. In some embodiments, a single damascene process is employed to form the intermediate conductive patterns 70L. One or more conductive layers are formed in the spaces 47 and over the upper surface of the first and second ILD layers, and one or more planarization operation, such as a chemical mechanical polishing (CMP) process, is performed to remove excess portions of the conductive layers. The structures shown in FIGS. 22A-22C correspond to the structures shown in FIGS. 10A-10D. Then, the operations as explained with respect to FIGS. 11A-15D are performed to obtain the structures shown in FIGS. 15A-16D.

In some embodiments, after the structure shown in FIGS. 15A-16D is obtained, second via contacts and third wiring patterns are formed over the second wiring patterns 80 by repeating the same or similar processes as explained above. In some embodiments, the second wiring pattern 80 and the third ILD layer 54 of FIGS. 15A-16D correspond to the first wiring pattern 60 and the lower layer 50A of the first ILD layer 50 as shown in FIG. 3F. By using the same or similar processes as FIGS. 3H-3J, second conductive patterns for the second via contacts are formed over the second wiring pattern 80, and then the operations as explained with respect to FIG. 4A-15D (or 19A-22C and FIGS. 11A-15D) are performed to obtain the second via contacts and third wiring patterns.

In some embodiments, the first via contact 70 is merely a conductive layer (made only of conductive materials) and does not have a memory function, such as a phase change memory, a resistance change memory or a magnetic memory.

In the foregoing embodiments, the first wiring pattern 60 is formed by etching using the first conductive pattern 70L as an etching mask, the first wiring pattern 60 and the first conductive pattern are formed in a self-aligned manner in at least one direction (X). Then, the first via contact 70 is formed by etching using the second wiring pattern 80 as an etching mask, and thus the first via contact 70 and the second wiring pattern 80 are formed in a self-aligned manner in the other direction (Y). Thus, the first wiring pattern 60, the first via contact 70 and the second wiring pattern 80 are all aligned regardless of an overlay error caused in one or more lithography operations.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a first conductive pattern is formed and a second conductive pattern is formed over the first conductive pattern, in a first interlayer dielectric (ILD) layer disposed over a substrate. The second conductive pattern contacts the first conductive pattern. A space is formed in the first ILD layer by removing a part of the second conductive pattern to expose a part of the first conductive pattern. The space is filled with a dielectric material. A third conductive pattern is formed over a remaining portion of the second conductive pattern. A via contact connecting the first conductive pattern and the third conductive pattern is formed by patterning the remaining portion of the second conductive pattern as an etching mask. In one or more of the foregoing or following embodiments, the first conductive pattern and the second conductive pattern extend in a first direction, and the third conductive pattern extends in a second direction crossing the first direction. In one or more of the foregoing or following embodiments, the first direction is perpendicular to the second direction. In one or more of the foregoing or following embodiments, the first direction and the second direction form an angle in a range from 30 degrees to 60 degrees. In one or more of the foregoing or following embodiments, a second ILD layer is formed and third ILD layer is further formed on the first ILD layer, the second ILD layer and a part of the first conductive pattern on which no via contact is formed. In one or more of the foregoing or following embodiments, the second conductive pattern is made of a different material than the first conductive pattern. In one or more of the foregoing or following embodiments, the second conductive pattern is made of a same material as the third conductive pattern. In one or more of the foregoing or following embodiments, the second conductive pattern and the third conductive pattern are made of Ru.

In accordance with another aspect of the present disclosure, in a method of manufacturing a semiconductor device, a first lower conductive pattern and a second lower conductive pattern, both extending in a first direction, are formed. A first intermediate conductive pattern is formed on the first lower conductive pattern and a second intermediate conductive pattern is formed on the second lower conductive pattern. The first and second lower conductive pattern and the first and second intermediate conductive pattern are embedded in a first interlayer dielectric (ILD) layer disposed over a substrate. A space is formed in the first ILD layer by removing a part of the first intermediate conductive pattern to expose a part of the first lower conductive pattern. The space is filled with a dielectric material. A first upper conductive pattern extending in a second direction crossing the first direction is formed on the second intermediate conductive pattern and over the part of the first lower conductive pattern. A first via contact connecting the first upper conductive pattern and the second lower conductive pattern is formed by patterning the second intermediate conductive pattern. The first via contact is formed at a cross point of the first upper conductive pattern and the second lower conductive pattern in plan view. In one or more of the foregoing or following embodiments, no via contact is formed at a cross point between the first upper conductive pattern and the first lower conductive pattern. In one or more of the foregoing or following embodiments, a hard mask layer is formed over the first ILD layer and the first and second intermediate conductive patterns, a hard mask pattern is formed by patterning the hard mask layer, and the first intermediate conductive pattern is patterned by using the hard mask pattern as an etching mask. In one or more of the foregoing or following embodiments, the hard mask layer includes TiN. In one or more of the foregoing or following embodiments, when the first upper conductive pattern is formed, a blanket conductive layer is formed over the first ILD layer, the dielectric material, and the first and second intermediate conductive patterns, a hard mask layer is formed over the blanket conductive layer, a hard mask pattern is formed by patterning the hard mask layer, and the blanket conductive layer is patterned by using the hard mask pattern as an etching mask. In one or more of the foregoing or following embodiments, the hard mask layer includes TiN. In one or more of the foregoing or following embodiments, the first and second lower conductive patterns are made of Cu or a Cu alloy, and the first and second intermediate conductive patterns are made of Ru or a Ru alloy. In one or more of the foregoing or following embodiments, when the first and second lower conductive patterns and the first and second intermediate conductive patterns are formed, a first blanket conductive layer for the first and second lower conductive patterns is formed, a second blanket conductive layer for the first and second intermediate conductive patterns is formed on the first blanket conductive layer, the first and second intermediate conductive patterns are formed by patterning the second blanket conductive layer, and the first and second lower conductive patterns are formed by patterning the first blanket conductive layer.

In accordance with another aspect of the present disclosure, in a method of manufacturing a semiconductor device, a first lower conductive pattern and a second lower conductive pattern, both extending in a first direction, are formed. A first intermediate conductive pattern is formed on the first lower conductive pattern and a second intermediate conductive pattern is formed on the second lower conductive pattern. The first and second lower conductive pattern and the first and second intermediate conductive pattern are embedded in a first interlayer dielectric (ILD) layer disposed over a substrate. A first space is formed in the first ILD layer by removing a part of the first intermediate conductive pattern to expose a part of the first lower conductive pattern and a second space is formed in the first ILD layer by removing a part of the second intermediate conductive pattern to expose a part of the second lower conductive pattern. The first and second spaces are filled with a dielectric material. A first upper conductive pattern extending in a second direction crossing the first direction is formed on the second intermediate conductive pattern and over the part of the first lower conductive pattern and a second upper conductive pattern extending a third direction crossing the first direction is formed on the first intermediate conductive pattern and over the part of the second lower conductive pattern. A first via contact connecting the first upper conductive pattern and the second lower conductive pattern is formed by patterning the second intermediate conductive pattern and a second via contact connecting the second upper conductive pattern and the first lower conductive pattern is formed by patterning the first intermediate conductive pattern. The first via contact is formed at a cross point of the first upper conductive pattern and the second lower conductive pattern in plan view, and the second via contact is formed at a cross point of the second upper conductive pattern and the first lower conductive pattern in plan view. In one or more of the foregoing or following embodiments, no via contact is formed at a cross point between the first upper conductive pattern and the first lower conductive pattern. In one or more of the foregoing or following embodiments, the third direction crosses the second direction. In one or more of the foregoing or following embodiments, the first and second lower conductive patterns are made of a different material than the first and second intermediate conductive patterns and the first and second upper conductive patterns.

In accordance with another aspect of the present disclosure, a semiconductor device includes transistors disposed over a substrate, a first wiring pattern disposed over the transistors and extending in a first direction, a second wiring pattern disposed above the first wiring pattern and extending in a second direction crossing the first direction, and a via contact connecting the first wiring pattern and the second wiring pattern. A contacting area between the first wiring pattern and the via contact has a rectangular shape having longer sides extending in the first direction, and a contacting area between the second wiring pattern and the via contact has a rectangular shape having longer sides extending in the second direction. In one or more of the foregoing or following embodiments, the contacting area between the first wiring pattern and the via contact has a different size from the contacting area between the second wiring pattern and the via contact. In one or more of the foregoing or following embodiments, the first direction is perpendicular to the second direction. In one or more of the foregoing or following embodiments, the first wiring pattern is made of a different material than the via contact. In one or more of the foregoing or following embodiments, the second wiring pattern is made of a different material than the first wiring pattern. In one or more of the foregoing or following embodiments, the second wiring pattern is made of a same material as the via contact. In one or more of the foregoing or following embodiments, a width of shorter sides of the contacting area between the first wiring pattern and the via contact is equal to a width of the first wiring pattern. In one or more of the foregoing or following embodiments, a width of shorter sides of the contacting area between the second wiring pattern and the via contact is equal to a width of the second wiring pattern.

In accordance with another aspect of the present disclosure, a semiconductor device includes transistors disposed over a substrate, a first wiring pattern disposed over the transistors and extending in a first direction, a second wiring pattern disposed above the first wiring pattern and extending in a second direction crossing the first direction, a via contact connecting the first wiring pattern and the second wiring pattern, a first interlayer dielectric (ILD) layer covering side surfaces of the first wiring pattern, a second ILD layer disposed on a part of the first wiring pattern, and a third ILD layer disposed on the first ILD layer, the second ILD layer, and a part of the first wiring pattern. The first ILD layer covers two side faces of the via contact and the third ILD layer covers other two side faces of the via contact. In one or more of the foregoing or following embodiments, an upper surface of the second ILD layer is located at a same level as a top of the via contact. In one or more of the foregoing or following embodiments, the third ILD layer contacts side faces of the second wiring pattern. In one or more of the foregoing or following embodiments, the third ILD layer contacts a side face of the second ILD layer. In one or more of the foregoing or following embodiments, the first wiring pattern is made of Cu or a Cu alloy. In one or more of the foregoing or following embodiments, the via contact is made of Ru or a Ru alloy. In one or more of the foregoing or following embodiments, the second wiring pattern is made of Ru or a Ru alloy.

In accordance with another aspect of the present disclosure, a semiconductor device includes a transistor disposed over a substrate and a plurality of wiring layers disposed over the transistor. The plurality of wiring layers includes an n-th wiring layer and an (n+1)-th wiring layer, the n-th wiring layer includes a first wiring pattern and a second wiring pattern, both extending in a first direction and a first via contact, and the (n+1)-th wiring layer includes a third wiring pattern extending in a second direction crossing the first direction. The third wiring pattern crosses the first and second wiring patterns in plan view, the first via contact is provided at a cross point between the third wiring pattern and the first wiring pattern to connect the third wiring pattern and the first wiring pattern, and no via contact is provided at a cross point between the third wiring pattern and the second wiring pattern. In one or more of the foregoing or following embodiments, the n-th wiring layer includes an interlayer dielectric (ILD) layer, and the ILD layer includes a first ILD layer and a second ILD layer disposed in trenches over a part of the first wiring pattern and a part of the second wiring pattern. In one or more of the foregoing or following embodiments, the second ILD layer is disposed between the third wiring pattern and the second wiring pattern at the cross point between the third wiring pattern and the second wiring pattern. In one or more of the foregoing or following embodiments, the (n+1)-th wiring layer includes a fourth wiring pattern extending in a third direction crossing the first direction and the second direction. In one or more of the foregoing or following embodiments, the first via contact has a trapezoidal cross section along the first direction and a reverse trapezoidal cross section along the second direction.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device comprising:
   forming a first conductive pattern and a second conductive pattern over the first conductive pattern, in a first interlayer dielectric (ILD) layer disposed over a substrate, the second conductive pattern contacting the first conductive pattern;
   forming a third conductive pattern over the second conductive pattern such that the second conductive patterns has portions covered by the third conductive pattern and portions not covered by the third conductive pattern;
   forming a via contact connecting the first conductive pattern and the third conductive pattern by removing a part of the portions of the second conductive pattern not covered by the third conductive pattern;
   forming a space in the first ILD layer by removing a part of the second conductive pattern to expose a part of the first conductive pattern before the third conductive pattern is formed; and
   filling the space with a dielectric material.

2. The method of claim 1, wherein:
   the first conductive pattern and the second conductive pattern extend in a first direction, and the third conductive pattern extends in a second direction crossing the first direction.

3. The method of claim 2, wherein the first direction is perpendicular to the second direction.

4. The method of claim 2, wherein the first direction and the second direction form an angle in a range from 30 degrees to 60 degrees.

5. The method of claim 1, further comprising forming a second ILD layer on a part of the first conductive pattern on which no via contact is formed.

6. The method of claim 1, wherein the second conductive pattern is made of a different material than the first conductive pattern.

7. The method of claim 1, wherein the second conductive pattern is made of a same material as the third conductive pattern.

8. A method of manufacturing a semiconductor device comprising:
   forming a first lower conductive pattern and a second lower conductive pattern, both extending in a first direction;
   forming a first intermediate conductive pattern on the first lower conductive pattern and a second intermediate conductive pattern on the second lower conductive pattern, the first and second lower conductive patterns and the first and second intermediate conductive patterns being embedded in a first interlayer dielectric (ILD) layer disposed over a substrate;
   forming a space in the first ILD layer by removing a part of the first intermediate conductive pattern to expose a part of the first lower conductive pattern;
   filling the space with a dielectric material;
   forming a first upper conductive pattern extending in a second direction crossing the first direction on the second intermediate conductive pattern and over the part of the first lower conductive pattern; and
   forming a first via contact connecting the first upper conductive pattern and the second lower conductive pattern by patterning the second intermediate conductive pattern,
   wherein the first via contact is formed at a cross point of the first upper conductive pattern and the second lower conductive pattern in plan view.

9. The method of claim 8, wherein no via contact is formed at a cross point between the first upper conductive pattern and the first lower conductive pattern.

10. The method of claim 8, wherein the space is formed by:
    forming a hard mask layer over the first ILD layer and the first and second intermediate conductive patterns;
    forming a hard mask pattern by patterning the hard mask layer; and
    patterning the first intermediate conductive pattern by using the hard mask pattern as an etching mask.

11. The method of claim 10, wherein the hard mask layer includes TiN.

12. The method of claim 8, wherein the first upper conductive pattern is formed by:
    forming a blanket conductive layer over the first ILD layer, the dielectric material, and the first and second intermediate conductive patterns;
    forming a hard mask layer over the blanket conductive layer;
    forming a hard mask pattern by patterning the hard mask layer; and
    patterning the blanket conductive layer by using the hard mask pattern as an etching mask.

13. The method of claim 12, wherein the hard mask layer includes TiN.

14. The method of claim 8, wherein the first and second lower conductive patterns are made of Cu or a Cu alloy, and the first and second intermediate conductive patterns are made of Ru or a Ru alloy.

15. The method of claim 8, wherein the first and second lower conductive patterns and the first and second intermediate conductive patterns are formed by:

forming a first blanket conductive layer for the first and second lower conductive patterns;

forming a second blanket conductive layer for the first and second intermediate conductive patterns on the first blanket conductive layer;

forming the first and second intermediate conductive patterns by patterning the second blanket conductive layer; and forming the first and second lower conductive patterns by patterning the first blanket conductive layer.

16. A method of manufacturing a semiconductor device comprising:

forming a first lower conductive pattern and a second lower conductive pattern, both extending in a first direction;

forming a first intermediate conductive pattern on the first lower conductive pattern and a second intermediate conductive pattern on the second lower conductive pattern, the first and second lower conductive pattern and the first and second intermediate conductive pattern being embedded in a first interlayer dielectric (ILD) layer disposed over a substrate;

forming a first space in the first ILD layer by removing a part of the first intermediate conductive pattern to expose a part of the first lower conductive pattern and a second space in the first ILD layer by removing a part of the second intermediate conductive pattern to expose a part of the second lower conductive pattern;

filling the first and second spaces with a dielectric material;

forming a first upper conductive pattern extending in a second direction crossing the first direction on the second intermediate conductive pattern and over the part of the first lower conductive pattern and a second upper conductive pattern extending a third direction crossing the first direction on the first intermediate conductive pattern and over the part of the second lower conductive pattern; and forming a first via contact connecting the first upper conductive pattern and the second lower conductive pattern by patterning the second intermediate conductive pattern and a second via contact connecting the second upper conductive pattern and the first lower conductive pattern by patterning the first intermediate conductive pattern, wherein the first via contact is formed at a cross point of the first upper conductive pattern and the second lower conductive pattern in plan view, and the second via contact is formed at a cross point of the second upper conductive pattern and the first lower conductive pattern in plan view.

17. The method of claim 16, wherein no via contact is formed at a cross point between the first upper conductive pattern and the first lower conductive pattern.

18. The method of claim 16, wherein the third direction crosses the second direction.

19. The method of claim 16, wherein the first and second lower conductive patterns are made of a different material than the first and second intermediate conductive patterns and the first and second upper conductive patterns.

20. The method of claim 16, wherein the first and second lower conductive patterns are made of Cu or a Cu alloy, and the first and second intermediate conductive patterns are made of Ru or a Ru alloy.

* * * * *